(12) United States Patent
Yeom

(10) Patent No.: US 12,150,305 B2
(45) Date of Patent: Nov. 19, 2024

(54) SEMICONDUCTOR MEMORY DEVICE AND METHOD OF MANUFACTURING SEMICONDUCTOR MEMORY DEVICE

(71) Applicant: SK hynix Inc., Icheon-si (KR)

(72) Inventor: Hyo Sub Yeom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 503 days.

(21) Appl. No.: 17/511,316

(22) Filed: Oct. 26, 2021

(65) Prior Publication Data

US 2022/0367506 A1 Nov. 17, 2022

(30) Foreign Application Priority Data

May 12, 2021 (KR) .................. 10-2021-0061383

(51) Int. Cl.
*H10B 43/40* (2023.01)
*H01L 29/10* (2006.01)
*H01L 29/792* (2006.01)

(52) U.S. Cl.
CPC ......... *H10B 43/40* (2023.02); *H01L 29/1095* (2013.01); *H01L 29/792* (2013.01)

(58) Field of Classification Search
CPC ........ H10B 43/40; H10B 43/27; H10B 41/27; H10B 43/10; H10B 43/50; H10B 43/20; H10B 43/35; H01L 29/1095; H01L 29/792; H01L 21/823475; H01L 25/0657; H01L 2225/06541
See application file for complete search history.

(56) References Cited

U.S. PATENT DOCUMENTS

| | | | | |
|---|---|---|---|---|
| 10,692,881 B2 * | 6/2020 | Hwang | .................. | H10B 43/27 |
| 10,777,572 B2 * | 9/2020 | Jung | .................. | H01L 29/40117 |
| 10,804,289 B2 * | 10/2020 | Yang | ..................... | H10B 43/10 |
| 10,825,832 B2 * | 11/2020 | Gu | ......................... | H10B 43/50 |
| 11,057,183 B2 * | 7/2021 | Son | ..................... | H01L 29/7827 |
| 11,063,057 B2 * | 7/2021 | Jung | ..................... | H10B 43/35 |
| 11,114,461 B2 * | 9/2021 | Ahn | ..................... | H10B 43/50 |
| 11,968,836 B2 * | 4/2024 | Son | ........................ | H10B 43/27 |

FOREIGN PATENT DOCUMENTS

| | | |
|---|---|---|
| KR | 1020200069826 A | 6/2020 |
| KR | 1020200127106 A | 11/2020 |

\* cited by examiner

*Primary Examiner* — Shahed Ahmed
*Assistant Examiner* — Khatib A Rahman
(74) *Attorney, Agent, or Firm* — WILLIAM PARK & ASSOCIATES LTD.

(57) ABSTRACT

A semiconductor memory device includes a semiconductor substrate including an upper surface extending in a horizontal direction, a source structure including a trench extending in the horizontal direction, the source structure disposed above the semiconductor substrate, a metal structure in the trench of the source structure and connecting the source structure to the semiconductor substrate, and memory cell strings disposed on both sides of the trench and connected to the source structure.

20 Claims, 38 Drawing Sheets

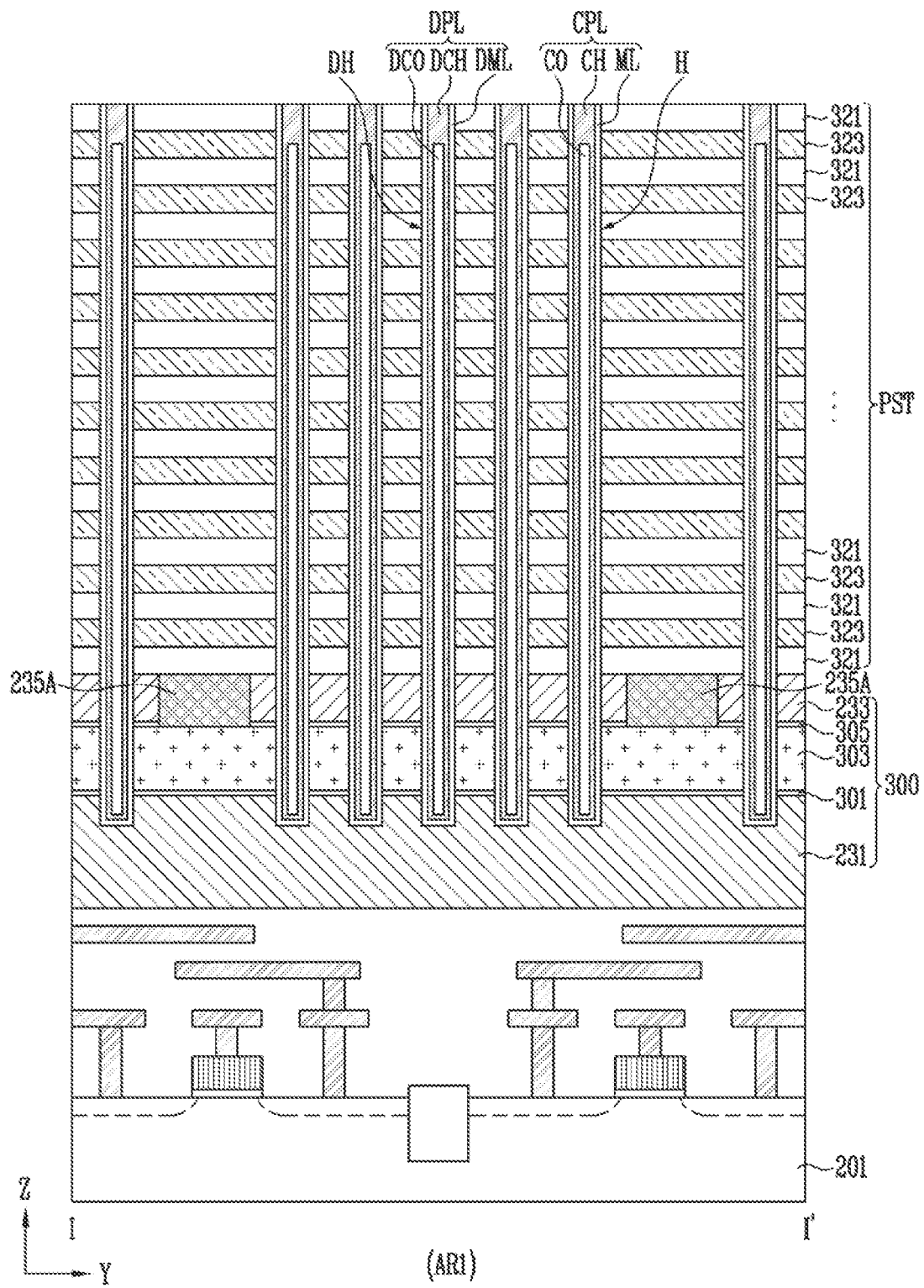

US 12,150,305 B2

SEMICONDUCTOR MEMORY DEVICE AND METHOD OF MANUFACTURING SEMICONDUCTOR MEMORY DEVICE

CROSS-REFERENCE TO RELATED APPLICATION

The present application claims priority under 35 U.S.C. § 119(a) to Korean patent application number 10-2021-0061383, filed on May 12, 2021, in the Korean Intellectual Property Office, the entire disclosure of which is incorporated herein by reference.

BACKGROUND

1. Technical Field

The present disclosure relates to a semiconductor memory device and a method of manufacturing a semiconductor memory device, and more particularly, to a three-dimensional semiconductor memory device and a method of manufacturing a three-dimensional semiconductor memory device.

2. Related Art

In order to improve an integration degree of a semiconductor memory device, a three-dimensional semiconductor memory device including a plurality of memory cells arranged in a three dimension has been proposed.

A three-dimensional semiconductor memory device may further improve the integration degree by increasing the number of memory cells stacked on a substrate. As the number of stacked memory cells increases, stability of a manufacturing process may be reduced.

SUMMARY

According to an embodiment of the present disclosure, a semiconductor memory device may include a semiconductor substrate including an upper surface extending in a horizontal direction, a source structure including a trench extending in the horizontal direction, the source structure disposed above the semiconductor substrate, a metal structure in the trench of the source structure and connecting the source structure to the semiconductor substrate, and memory cell strings disposed on both sides of the trench and connected to the source structure.

According to an embodiment of the present disclosure, a semiconductor memory device may include a semiconductor substrate including a first region, a second region, and a third region, in which the second region is disposed between the first region and the third region, gate stacks disposed above the first region of the semiconductor substrate, a source structure disposed at a level between each of the gate stacks and the semiconductor substrate to overlap the first region and the second region of the semiconductor substrate, a first source insulating pattern disposed at a level between each of the gate stacks and the semiconductor substrate to overlap the third region of the semiconductor substrate, a vertical structure disposed between the gate stacks and extending into the source structure, and a metal structure connecting the source structure to the semiconductor substrate.

According to an embodiment of the present disclosure, a method of manufacturing a semiconductor memory device may include forming a source stack, forming a first source insulating pattern passing through the source stack, forming a recess including a first contact hole passing through the first source insulating pattern and a trench connected to the first contact hole and defined inside the source stack, forming a metal structure including a horizontal pattern in the trench and a vertical pattern connected to the horizontal pattern and formed in the first contact hole, forming a preliminary gate stack by alternately stacking first material layers and second material layers on the source stack, forming cell plugs passing through the preliminary gate stack at both sides of the vertical pattern of the metal structure, forming a slit extending to pass through the preliminary gate stack overlapping the horizontal pattern of the metal structure and pass through the horizontal pattern of the metal structure, and replacing a portion of the source stack with an interlayer semiconductor layer through the slit.

BRIEF DESCRIPTION OF THE DRAWINGS

FIGS. 11A, 11B, and 11C are cross-sectional views illustrating a step of forming a preliminary gate stack and a step of forming cell plugs.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

Hereinafter, the terms 'first' and 'second' are used to distinguish one component from another component and are not meant to imply a specific number or order of components. The terms may be used to describe various components, but the components are not limited by the terms.

Some embodiments are directed to a semiconductor memory device and a method of manufacturing of the semiconductor memory device capable of improving stability of a manufacturing process.

Figure 1:
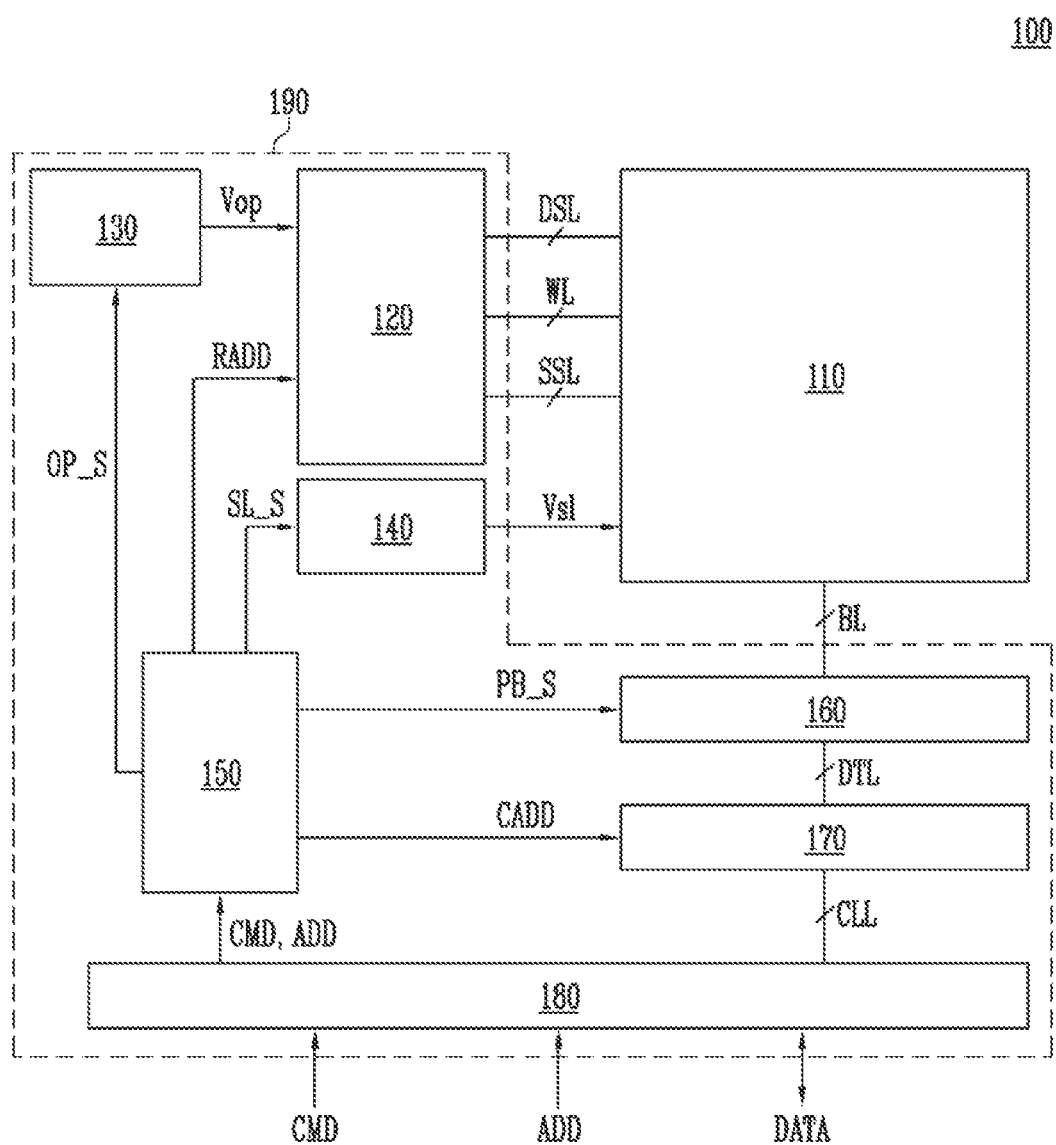
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 may include a peripheral circuit structure 190 and a memory cell array 110.

The peripheral circuit structure 190 may be configured to perform a program operation and a verify operation for storing data in the memory cell array 110, a read operation for outputting the data stored in the memory cell array 110, and an erase operation for erasing the data stored in the memory cell array 110. The peripheral circuit structure 190 may include an input/output circuit 180, a control circuit 150, a voltage generation circuit 130, a row decoder 120, a column decoder 170, a page buffer 160, and a source line driver 140.

The memory cell array 110 may include a plurality of memory cells in which data is stored. As an embodiment, the memory cell array 110 may include a three-dimensional memory cell array. The plurality of memory cells may store data of a single-bit or multi-bit of two or more bits for each cell. The plurality of memory cells may configure a plurality of memory cell strings. Each memory cell string may include a plurality of memory cells connected in series through a channel layer. The channel layer may be connected to the page buffer 160 through a corresponding bit line BL among a plurality of bit lines BL.

The input/output circuit 180 may transmit a command CMD and an address ADD received from an external device (for example, a memory controller) of the semiconductor memory device 100 to the control circuit 150. The input/output circuit 180 may exchange data DATA with an external device and the column decoder 170.

In response to the command CMD and the address ADD, the control circuit 150 may output an operation signal OP_S, a row address RADD, a source line control signal SL_S, a page buffer control signal PB_S, and a column address CADD.

The voltage generation circuit 130 may generate various operation voltages Vop used for the program operation, the verify operation, the read operation, and the erase operation in response to the operation signal OP_S.

The row decoder 120 may be connected to the memory cell array 110 through a plurality of drain select lines DSL, a plurality of word lines WL, and a plurality of source select lines SSL. The row decoder 120 may transmit the operation voltages Vop to the plurality of drain select lines DSL, the plurality of word lines WL, and the plurality of source select lines SSL in response to the row address RADD.

In response to the column address CADD, the column decoder 170 may transmit the data DATA input from the input/output circuit 180 to the page buffer 160, or transmit the data DATA stored in the page buffer 160 to the input/output circuit 180. The column decoder 170 may exchange the data DATA with the input/output circuit 180 through column lines CLL. The column decoder 170 may exchange the data DATA with the page buffer 160 through data lines DTL.

The page buffer 160 may be connected to the memory cell array 110 through the bit line BL. The page buffer 160 may temporarily store the data DATA received through the plurality of bit lines BL in response to the page buffer control signal PB_S. The page buffer 160 may sense a voltage or a current of the plurality of bit lines BL during the read operation.

The source line driver 140 may transmit a source voltage Vsl supplied from the source line driver 140 to the memory cell array 110 in response to the source line control signal SL_S.

Figure 2:
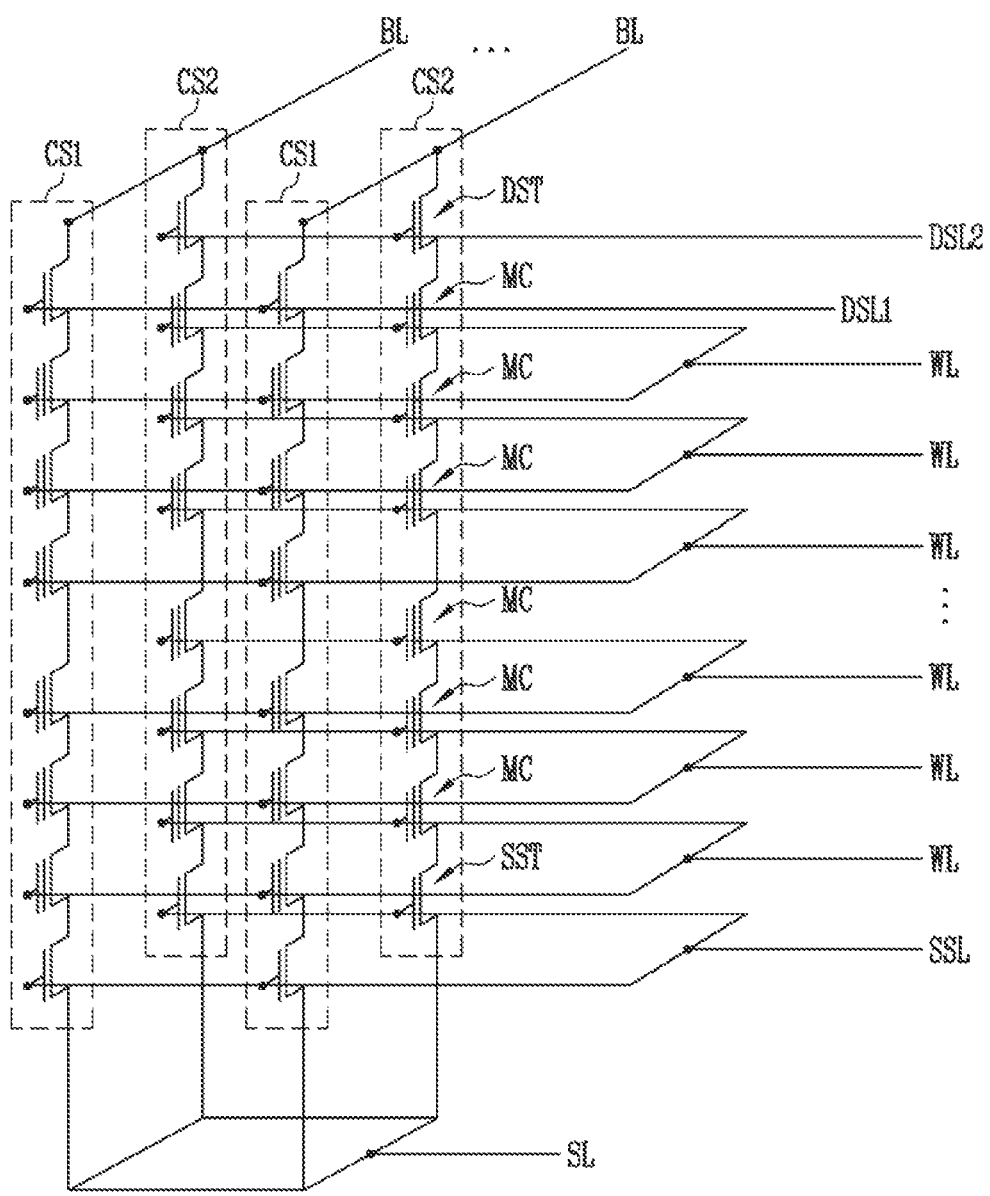
FIG. 2 is a circuit diagram illustrating an embodiment of a memory cell array shown in FIG. 1.

FIG. 2 is a circuit diagram illustrating an embodiment of the memory cell array shown in FIG. 1.

Referring to FIG. 2, the memory cell array may include a plurality of memory cell strings CS1 and CS2 connected to the plurality of bit lines BL. The plurality of memory cell strings CS1 and CS2 may be commonly connected to a source line SL. As an embodiment, a plurality of first memory cell strings CS1 and a plurality of second memory cell strings CS2 may be commonly connected to the source line SL.

A pair of first memory cell strings CS1 and second memory cell strings CS2 may be connected to each bit line BL.

Each of the first memory cell strings CS1 and each of the second memory cell strings CS2 may include a source select transistor SST, a plurality of memory cells MC, and a drain select transistor DST disposed between the source line SL and the bit line BL.

The source select transistor SST may control an electrical connection between the plurality of memory cells MC and the source line SL. One source select transistor SST may be disposed between the source line SL and the plurality of memory cells MC. Although not shown in the drawing, two or more source select transistors connected in series between the source line SL and the plurality of memory cells MC may be disposed. A gate of the source select transistor SST may be connected to the source select line SSL. Operation of the source select transistor SST may be controlled by a source gate signal applied to the source select line SSL.

The plurality of memory cells MC may be disposed between the source select transistor SST and the drain select transistor DST. The plurality of memory cells MC between the source select transistor SST and the drain select transistor DST may be connected in series. Gates of the plurality of memory cells MC may be connected to the plurality of word lines WL, respectively. Operation of each memory cell MC may be controlled by cell gate signals applied to a corresponding word line WL.

The drain select transistor DST may control an electrical connection between the plurality of memory cells MC and the bit line BL. A gate of the drain select transistor DST may be connected to a drain select line DSL1 or DSL2. Operation of the drain select transistor DST may be controlled by a drain gate signal applied to the drain select line DSL1 or DSL2.

The plurality of first memory cell strings CS1 may be connected to the first drain select line DSL1. The plurality of second memory cell strings CS2 may be connected to the second drain select line DSL2. Accordingly, one memory cell string among the plurality of first memory cell strings CS1 and the plurality of second memory cell strings CS2 may be selected, by selecting one bit line among the plurality of bit lines BL and selecting one drain select line among the first drain select line DSL1 and the second drain select line DSL2.

The plurality of first memory cell strings CS1 and the plurality of second memory cell strings CS2 may be commonly connected to each word line WL.

The plurality of first memory cell strings CS1 and the plurality of second memory cell strings CS2 may be commonly connected to the source select line SSL. An embodiment of the present disclosure is not limited thereto. Although not shown in the drawing, as an embodiment, the memory cell array may include a first source select line and a second source select line separated from each other. The first source select line may be connected to the plurality of first memory cell strings, and the second source select line may be connected to the plurality of second memory cell strings.

Figure 3:
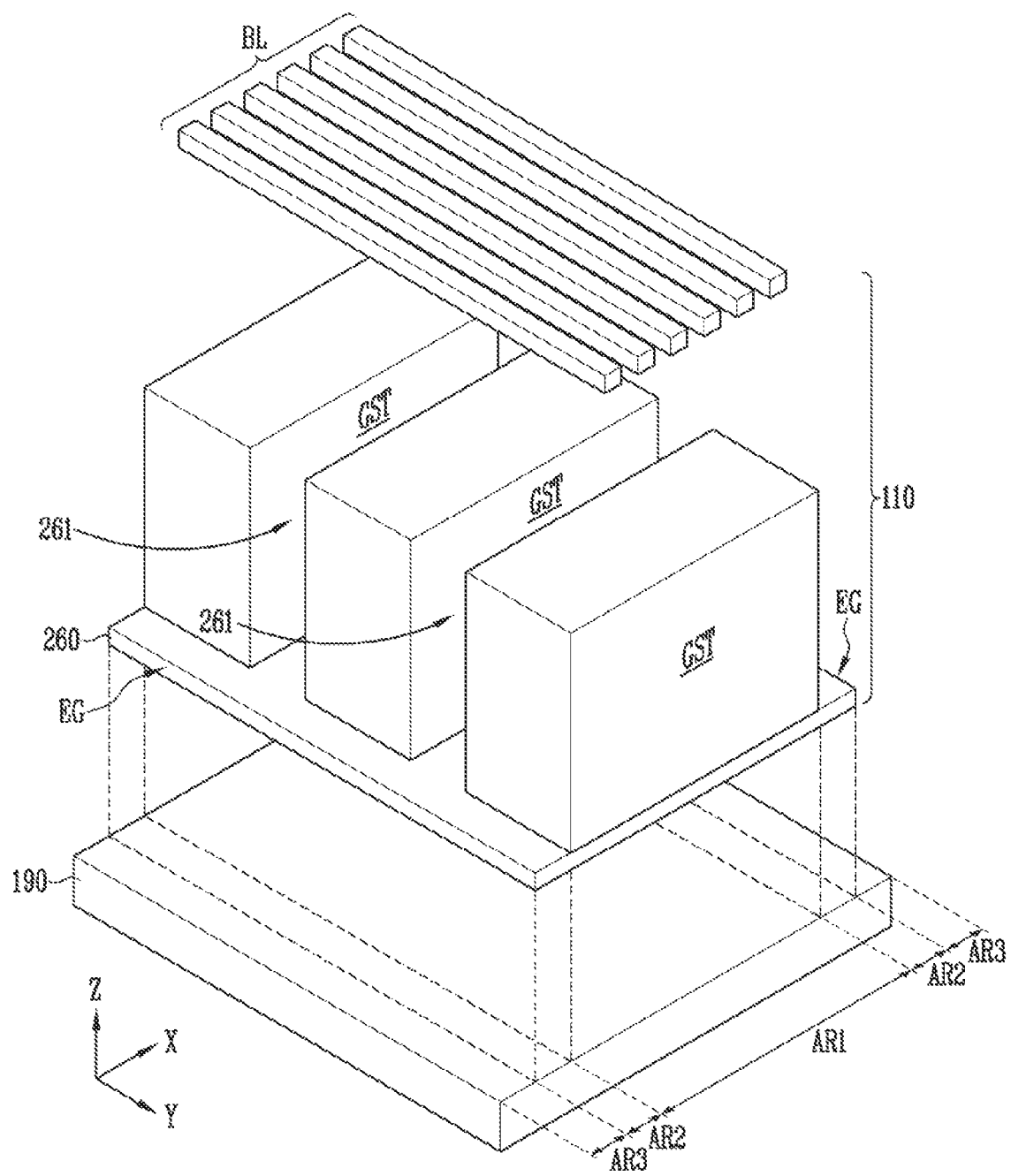
FIG. 3 is a diagram schematically illustrating an embodiment of an arrangement of the memory cell array and a peripheral circuit structure shown in FIG. 1.

FIG. 3 is a diagram schematically illustrating an embodiment of an arrangement of the memory cell array and the peripheral circuit structure shown in FIG. 1.

Referring to FIG. 3, the peripheral circuit structure 190 may be disposed under the memory cell array 110. The peripheral circuit structure 190 may include a first region AR1, a second region AR2, and a third region AR3. The second region AR2 may be defined between the first region AR1 and the third region AR3. The first region AR1, the second region AR2, and the third region AR3 may extend in parallel with each other. As an embodiment, each of the first region AR1, the second region AR2, and the third region AR3 may extend in a Y-axis direction of an XYZ coordinate system.

The memory cell array 110 may include a source structure 260, a plurality of gate stacks GST, and the plurality of bit lines BL.

The source structure 260 may extend in an XY plane of the XYZ coordinate system. The source structure 260 may overlap the first region AR1 and the second region AR2 of the peripheral circuit structure 190. The source structure 260 may include an edge EG defined along a boundary between the second region AR2 and the third region AR3 of the peripheral circuit structure 190. The third region AR3 of the peripheral circuit structure 190 may be opened by the source structure 260.

The plurality of gate stacks GST may be disposed on the source structure 260. The plurality of gate stacks GST may be spaced apart from each other by a slit 261. The slit 261 may cross an extension direction of the first region AR1, the second region AR2, and the third region AR3 of the peripheral circuit structure 190. As an embodiment, the slit 261 may extend in an X-axis direction.

Each gate stack GST may include a plurality of conductive patterns connected to the plurality of memory cell strings CS1 and CS2 shown in FIG. 2. The plurality of conductive patterns of the gate stack GST may be spaced apart from each other in a Z-axis direction, and may be used as the source select line SSL, the plurality of word lines WL, the first drain select line DSL1, and the second drain select line DSL2 shown in FIG. 2. Furthermore, in an embodiment, the source structure 260 may be used as the source line SL shown in FIGS. 1 and 2.

The plurality of bit lines BL may be disposed above the plurality of gate stacks GST. The plurality of bit lines BL may extend in parallel with each other. The plurality of bit lines BL may extend in a direction crossing the slit 261. As an embodiment, the plurality of bit lines BL may extend in the Y-axis direction.

Hereinafter, structures of the semiconductor memory device shown in FIG. 3 are described with reference to FIGS. 4, 5A, 5B, and 5C.

Figure 4:
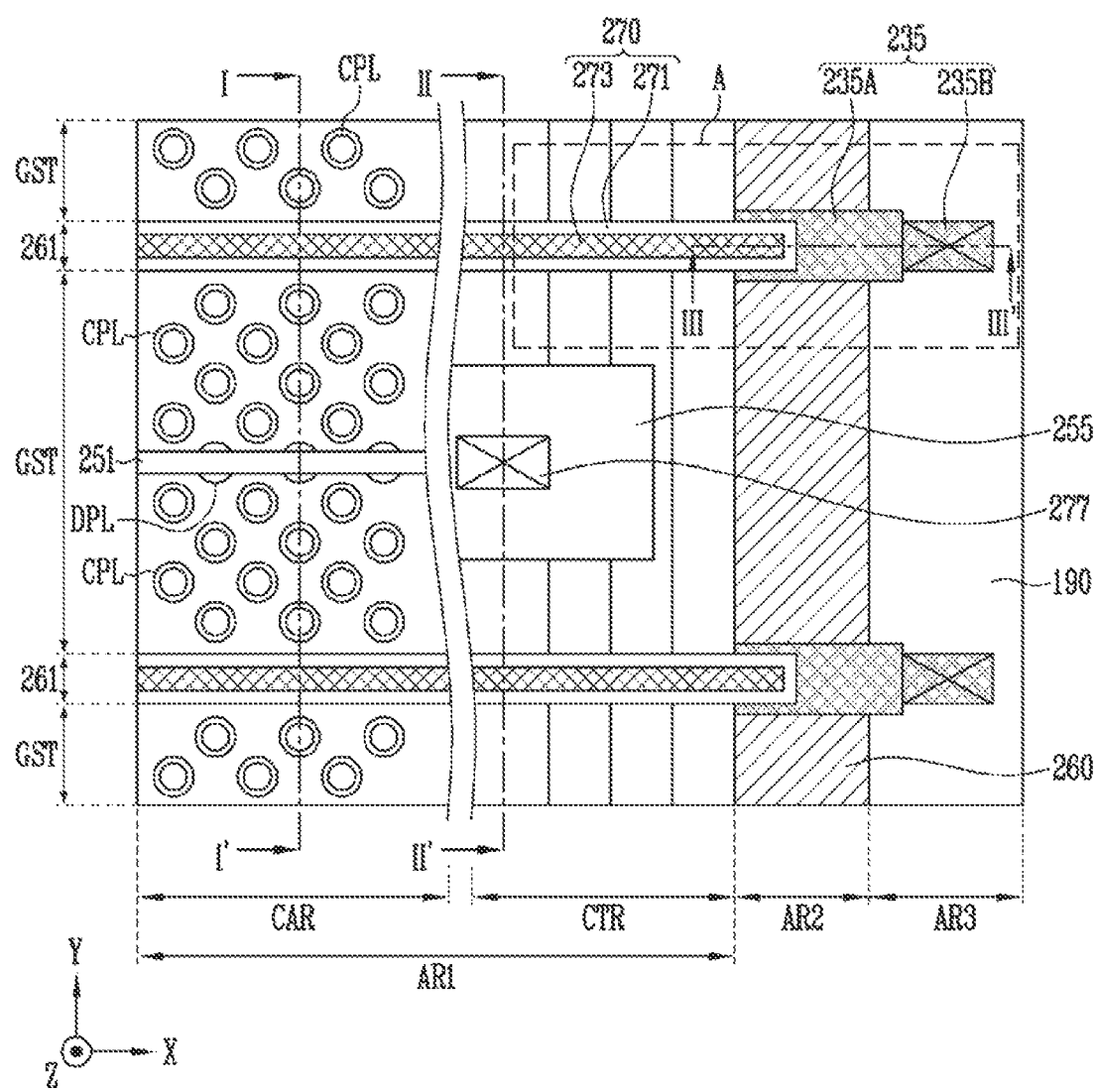
FIG. 4 is a plan view illustrating a portion of the memory cell array shown in FIG. 3.

FIG. 4 is a plan view illustrating a portion of the memory cell array shown in FIG. 3.

Referring to FIG. 4, each gate stack GST may include a cell array region CAR and a contact region CTR. The cell array region CAR and the contact region CTR of the gate stack GST may overlap the first region AR1 of the peripheral circuit structure 190.

A gate separation structure 251 may be buried in the gate stack GST. The gate separation structure 251 may be an insulator that separates the first drain select line DSL1 and the second drain select line DSL2 shown in FIG. 2 from each other. The gate separation structure 251 may extend parallel to the slit 261. As an embodiment, the gate separation structure 251 may extend in the X-axis direction.

A plurality of cell plugs CPL may be disposed on both sides of the gate separation structure 251. The plurality of cell plugs CPL may extend in the Z-axis direction to pass through the cell array region CAR of the gate stack GST.

The gate stack GST may be passed through by a plurality of dummy plugs DPL arranged in a line along an extension direction of the gate separation structure 251. The gate separation structure 251 may extend into each of the dummy plugs DPL.

At least one gate stack GST may be passed through by a filling insulating layer 255 in the contact region CTR. The filling insulating layer 255 may be passed through by an upper contact 277.

A vertical structure 270 may be formed in the slit 261. In an embodiment, the slit 261 may be filled with a vertical structure 270. The vertical structure 270 may extend into the source structure 260. The vertical structure 270 may protrude in a horizontal direction than the gate stack GST. The horizontal direction may be parallel to the XY plane. As an embodiment, the vertical structure 270 may protrude in the X-axis direction than the gate stack GST. The vertical structure 270 may include a conductive source contact 273 and a spacer insulating layer 271 surrounding a sidewall of the conductive source contact 273. The conductive source contact 273 may include at least one of a doped semiconductor layer, a metal silicide layer, a metal barrier layer, and a metal layer. Although not shown in the drawing, as an embodiment, the vertical structure 270 may be configured of an insulating material filling the slit 261.

The source structure 260 may overlap the first region AR1 of the peripheral circuit structure 190 and may protrude further than the gate stack GST in the horizontal direction. As an embodiment, the source structure 260 may protrude further than the gate stack GST in the X-axis direction. The source structure 260 may be used as the source line SL shown in FIGS. 1 and 2.

The peripheral circuit structure 190 may protrude further than the source structure 260 in the horizontal direction. As an embodiment, the third region AR3 of the peripheral circuit structure 190 may extend from the second region AR2 to protrude further than the source structure 260 in the X-axis direction.

Figure 5A:
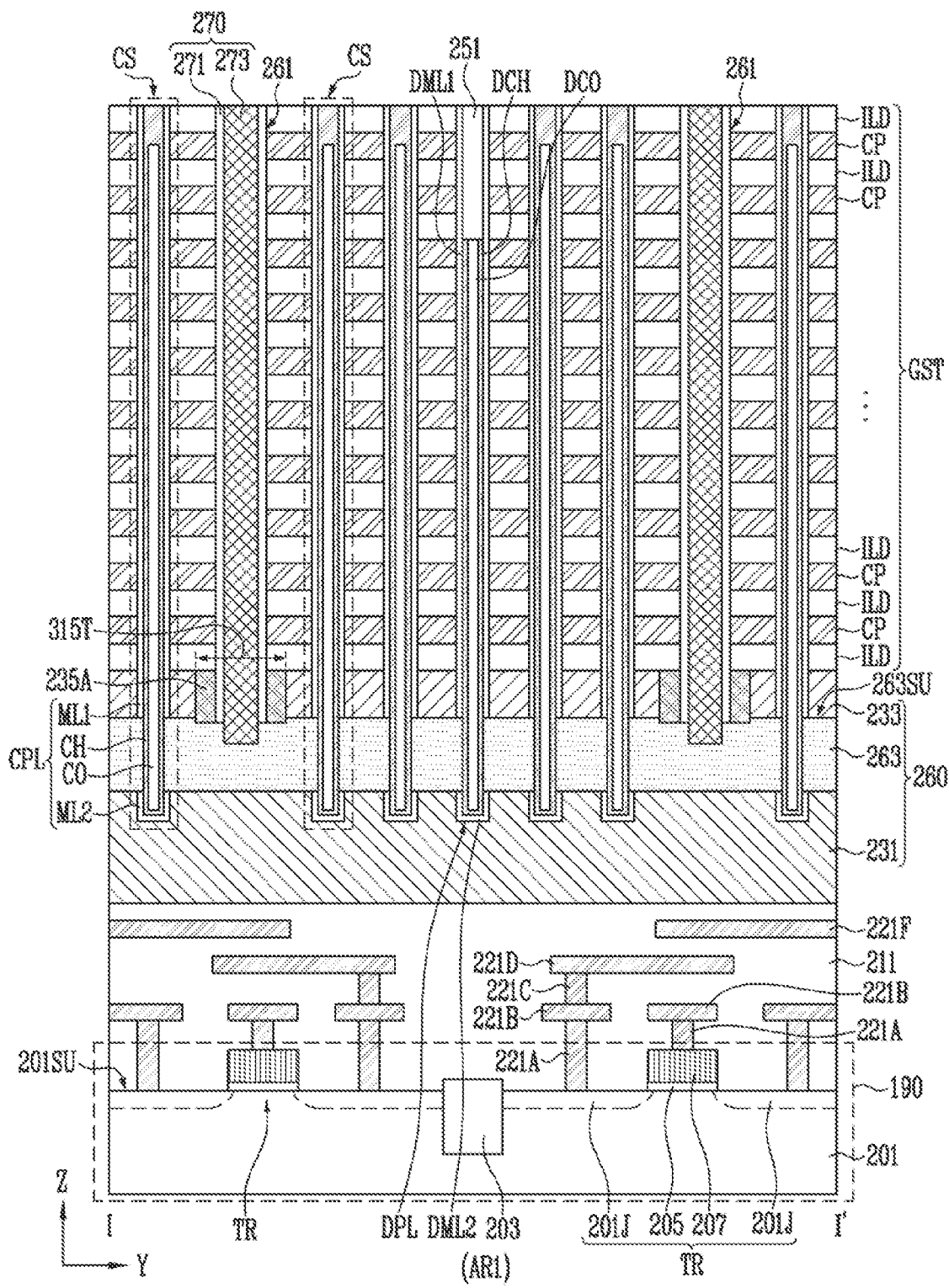
FIGS. 5A, 5B, and 5C are cross-sectional views illustrating a semiconductor memory device according to an embodiment of the present disclosure taken along a line I-I', a line II-II', and a line III-III' shown in FIG. 4.
Figure 5B:
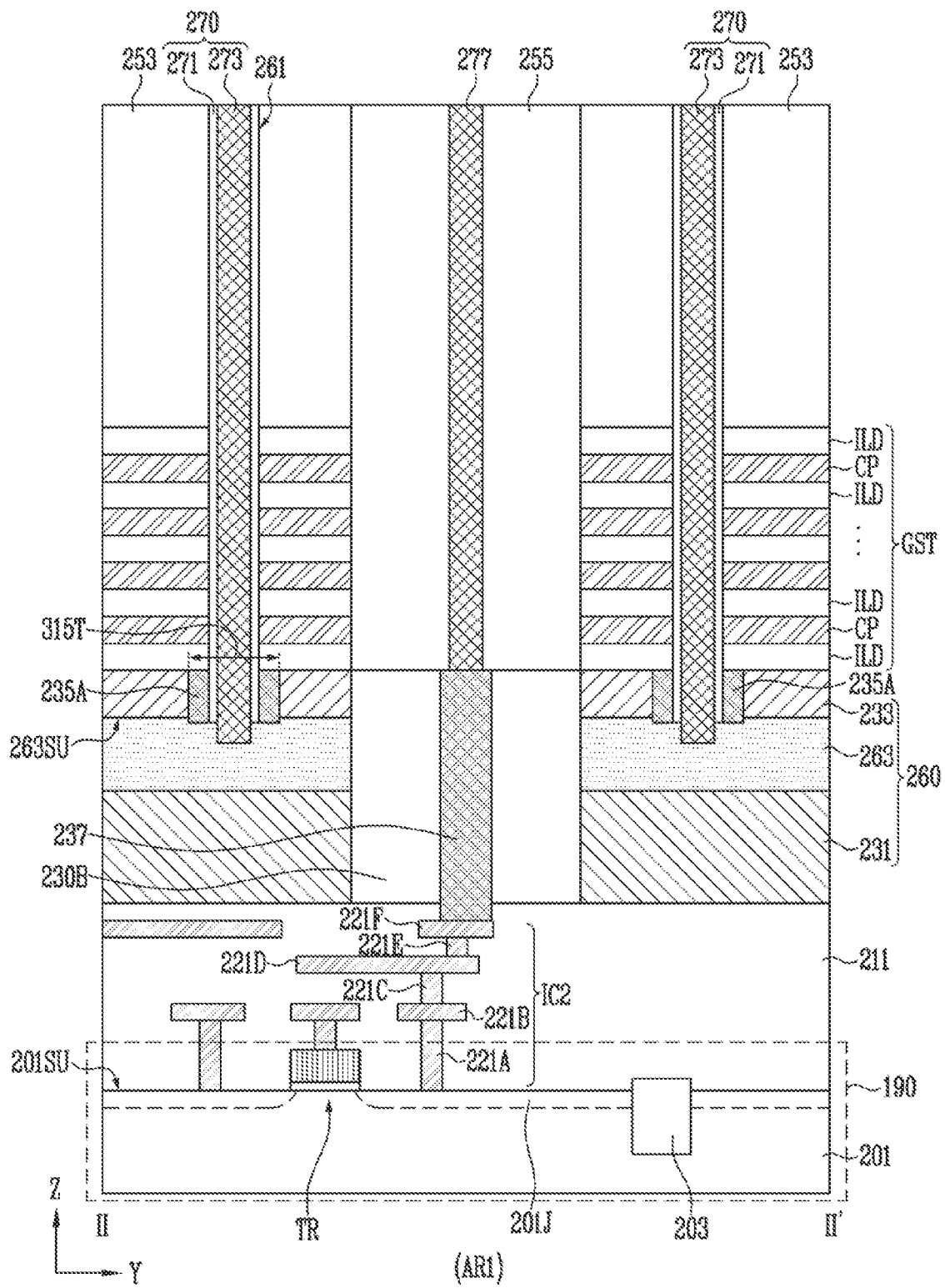
Figure 5C:
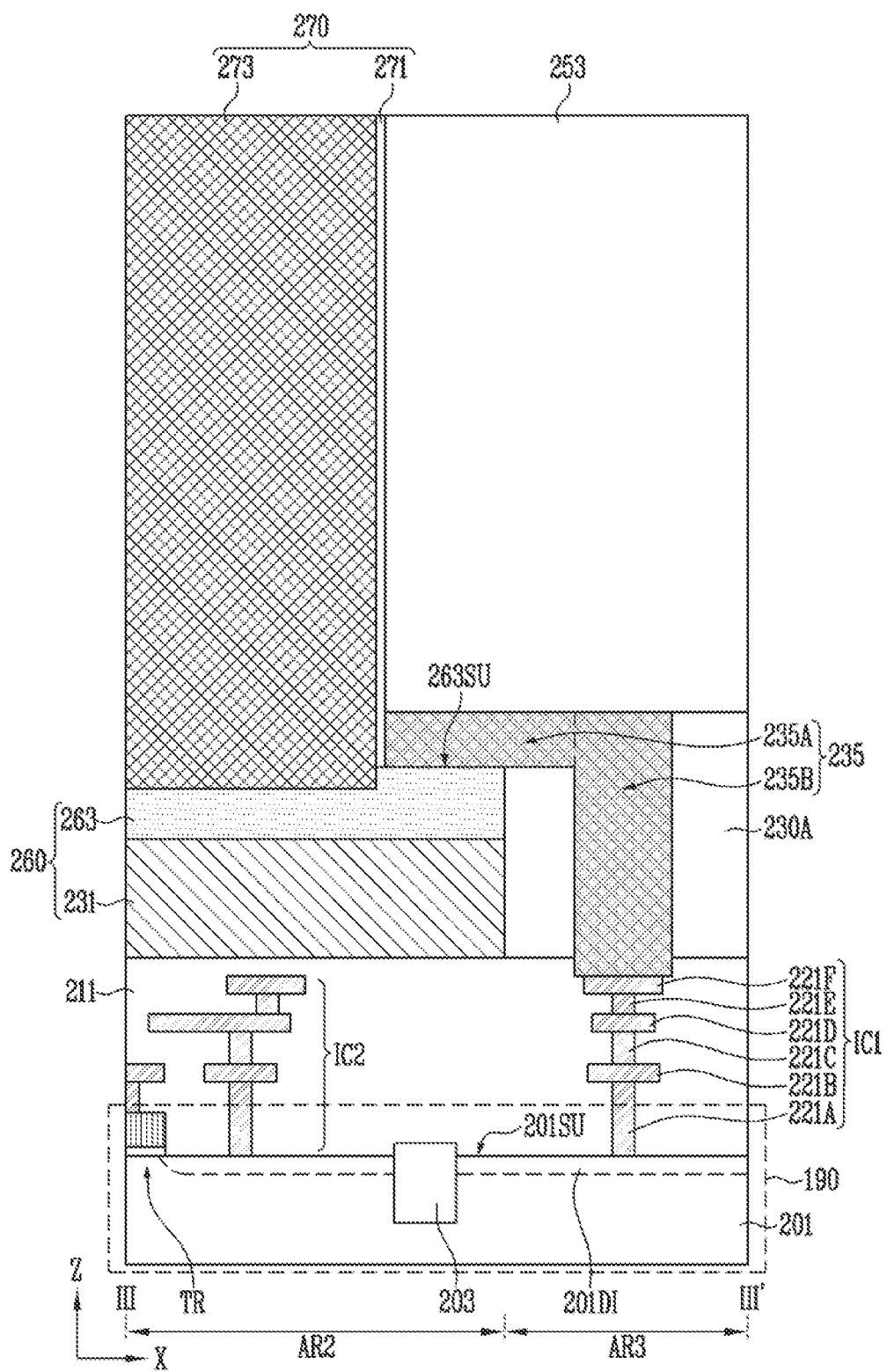

The peripheral circuit structure 190 may include a semiconductor substrate 201 as shown in FIGS. 5A to 5C. In the third region AR3 of the peripheral circuit structure 190, the semiconductor substrate may be connected to the source structure 260 through a metal structure 235.

The metal structure 235 may include a horizontal pattern 235A and a vertical pattern 235B integrated with each other. The vertical pattern 235B of the metal structure 235 may overlap the third region AR3 of the peripheral circuit structure 190. The horizontal pattern 235A of the metal structure 235 may extend in the horizontal direction from the vertical pattern 235B toward the vertical structure 270. The horizontal pattern 235A may include a portion buried in the source structure 260. The vertical pattern 235B may be spaced apart from the source structure 260, and the horizontal pattern 235A may protrude further than the source structure 260 in the horizontal direction toward the vertical pattern 235B.

FIGS. 5A, 5B, and 5C are cross-sectional views illustrating a semiconductor memory device according to an embodiment of the present disclosure taken along a line I-I', a line II-II', and a line III-III' shown in FIG. 4. FIG. 5A illustrates the first region AR1 of the peripheral circuit structure 190 and the cell array region CAR of the gate stack GST overlapping therewith. FIG. 5B illustrates the first region AR1 of the peripheral circuit structure 190 and the contact region CTR of the gate stack GST overlapping therewith. FIG. 5C illustrates the second region AR2 and the third region AR3 of the peripheral circuit structure 190 and a portion of the metal structure 235 overlapping therewith.

Referring to FIGS. 5A to 5C, the peripheral circuit structure 190 may include a semiconductor substrate 201 and a plurality of transistors TR formed on the semiconductor substrate 201. The plurality of transistors TR may be included in at least one of the row decoder 120, the column decoder 170, the page buffer 160, and the source line driver 140 shown in FIG. 1. As an embodiment, the plurality of transistors TR may configure the page buffer 160. Each transistor TR may include a gate insulating layer 205 on the semiconductor substrate 201, a gate electrode 207 on the gate insulating layer 205, and junctions 201J defined in the semiconductor substrate 201 on both sides of the gate electrode 207. Each junction 201J may be a portion of a plurality of impurity regions defined in the semiconductor substrate 201.

Similarly to the peripheral circuit structure 190, the semiconductor substrate 201 may include the first region AR1, the second region AR2, and the third region AR3. The semiconductor substrate 201 may have an upper surface 201SU extending in the horizontal direction. For example, the semiconductor substrate 201 may have the upper surface 201SU extending along the XY plane. The plurality of impurity regions of the semiconductor substrate 201 may be separated by a plurality of isolation layers 203. The plurality of impurity regions may include a discharge region 201DI and the junction 201J of the transistor TR. The junction 201J may include at least one of an n-type and p-type impurity. The discharge region 201DI may include an impurity of a conductivity type different from that of the source structure 260. As an embodiment, the source structure 260 may include an n-type impurity, and the discharge region 201DI may include a p-type impurity.

The peripheral circuit structure 190 may be covered with a lower insulating structure 211. The lower insulating structure 211 may include two or more insulating layers. Each of the discharge region 201DI and the transistor TR may be connected to an interconnection IC1 or IC2. For example, the discharge region 201DI may be connected to the first interconnection IC1, and the transistor TR may be connected to the second interconnection IC2. Each of the first interconnection IC1 and the second interconnection IC2 may be defined by a connection structure between a plurality of conductive patterns 221A, 221B, 221C, 221D, 221E, and 221F buried in the lower Insulating structure 211.

The source structure 260 may have a trench 315T extending in the horizontal direction. The source structure 260 may be disposed on the lower insulating structure 211 at a level between the gate stack GST and the semiconductor substrate 201. The source structure 260 may include a doped semiconductor layer. As an embodiment, the source structure 260 may include a stack structure of a first semiconductor layer 231, an interlayer semiconductor layer 263, and a second semiconductor layer 233. Each of the first semiconductor layer 231, the interlayer semiconductor layer 263, and the second semiconductor layer 233 may be a doped semiconductor layer and may include an n-type impurity. The first semiconductor layer 231 may overlap the trench 315T. The second semiconductor layer 233 may be disposed above the first semiconductor layer 231 and may be passed through by the trench 315T. The interlayer semiconductor layer 263 may be disposed between the first semiconductor layer 231 and the second semiconductor layer 233, and may overlap the trench 315T.

The source structure 260 may be passed through by a first source insulating pattern 230A and a second source insulating pattern 230B. The first source insulating pattern 230A and the second source insulating pattern 230B may be disposed on the lower insulating structure 211 at the level between the gate stack GST and the semiconductor substrate 201. The first source insulating pattern 230A may overlap the third region AR3 of the semiconductor substrate 201. The second source insulating pattern 230B may overlap the first region AR1 of the semiconductor substrate 201.

Referring to FIG. 5B, the second source insulating pattern 230B may be passed through by the lower contact 237. The lower contact 237 may be connected to the second interconnection IC2. As an embodiment, the lower contact 237 may be connected to the junction 201J of the transistor TR through the second interconnection IC2.

Referring to FIG. 5C, the first source insulating pattern 230A may be passed through by the vertical pattern 235B of the metal structure 235. The vertical pattern 235B may be connected to the first interconnection IC1. The first interconnection IC1 may electrically connect the vertical pattern 235B and the discharge region 201DI to each other. The vertical pattern 235B may be spaced apart from the source structure 260 in the horizontal direction. As an embodiment, the vertical pattern 235B may be spaced apart from the source structure 260 in the X-axis direction. The first source insulating pattern 230A may include a portion disposed between the vertical pattern 235B of the metal structure 235 and the source structure 260. Accordingly, the vertical pattern 235B of the metal structure 235 may be spaced apart from the source structure 260 by the first source insulating pattern 230A.

Referring to FIGS. 5A to 5C, the horizontal pattern 235A of the metal structure 235 may extend from the vertical pattern 253B toward the vertical structure 270 in the horizontal direction. In an embodiment, the horizontal pattern 235A may be formed in the trench 315T of the source structure 260. In an embodiment, the horizontal pattern 235A may fill the trench 315T of the source structure 260. The vertical structure 270 may extend into the trench 315T toward the semiconductor substrate 201. The horizontal pattern 235A of the metal structure 235 may remain between a portion of the vertical structure 270 extending into the trench 315T and the second semiconductor layer 233.

The conductive source contact 273 of the vertical structure 270 may be in contact with the interlayer semiconductor layer 263 of the source structure 260. The spacer insulating layer 271 of the vertical structure 270 may be disposed between the gate stack GST and the conductive source contact 273, and may extend between the horizontal pattern 235A of the metal structure 235 and the conductive source contact 273.

The interlayer semiconductor layer 263 of the source structure 260 may have an upper surface 263SU that is in contact with the horizontal pattern 235A of the metal structure 235. The first semiconductor layer 231 of the source structure 260 may be disposed at a level between the semiconductor substrate 201 and the horizontal pattern 235A of the metal structure 235. The vertical pattern 235B of the metal structure 235 may extend from the horizontal pattern 235A toward the semiconductor substrate 201 to be in contact with the first interconnection IC1.

A plurality of memory cell strings CS may be defined on both sides of the trench 315T and the vertical structure 270. Each memory cell string CS may be connected to the source structure 260 and a plurality of conductive patterns CP of the gate stack GST. The gate stack GST may include a plurality of interlayer insulating layers ILD as well as the plurality of conductive patterns CP. The plurality of conductive patterns CP and the plurality of interlayer insulating layers ILD may be alternately stacked on the source structure 260 in the Z-axis direction. Each conductive pattern CP may be formed of various conductive materials such as a doped semiconductor layer, a metal layer, and a conductive metal nitride. The conductive pattern CP may be formed of a single conductive material or may include two or more types of conductive materials. Each interlayer insulating layer ILD may include a silicon oxide layer.

The memory cell string CS may be defined by the plurality of conductive patterns CP and a cell plug CPL. The cell plug CPL may include a first memory pattern ML1, a channel layer CH, a core insulating layer CO, and a second memory pattern ML2.

The channel layer CH may pass through the gate stack GST. The channel layer CH may extend into the source structure 260 to be in contact with the source structure 260. As an embodiment, the channel layer CH may pass through the second semiconductor layer 233 of the source structure 260 and may extend into the first semiconductor layer 231. The interlayer semiconductor layer 263 of the source structure 260 may be in contact with a sidewall of the channel layer CH and surround the sidewall of the channel layer CH. The channel layer CH may be used as a channel region of the memory cell string CS. The channel layer CH may be configured of a semiconductor layer. The channel layer CH may extend along a sidewall, a bottom surface, and an upper surface of the core insulating layer CO. A doped region may be defined at an end portion of the channel layer CH formed on the core insulating layer CO. The doped region of the channel layer CH may include an n-type impurity.

The first memory pattern ML1 may be disposed between the gate stack GST and the channel layer CH. The first memory pattern ML1 may extend between the second semiconductor layer 233 of the source structure 260 and the channel layer CH. The second memory pattern ML2 may be disposed between the first semiconductor layer 231 of the source structure 260 and the channel layer CH. Although not specifically shown in the drawing, each of the first memory pattern ML1 and the second memory pattern ML2 may include a first blocking insulating layer extending along a surface of the channel layer CH, a data storage layer between the first blocking layer and the channel layer CH, and a tunnel insulating layer between the data storage layer and the channel layer CH. The tunnel insulating layer may include an insulating material capable of charge tunneling.

As an embodiment, the tunnel insulating layer may include a silicon oxide layer. The data storage layer may include an insulating material capable of trapping charges. As an embodiment, the data storage layer may include a nitride layer. The first blocking insulating layer may include a silicon oxide layer. Although not shown in the drawing, a second blocking insulating layer may be additionally disposed between the first blocking insulating layer and each conductive pattern CP. The second blocking insulating layer may include an oxide of which dielectric constant is higher than that of the first blocking insulating layer. As an embodiment, the second blocking insulating layer may include metal oxide such as an aluminum oxide layer. The second blocking insulating layer may extend between the conductive pattern CP and the interlayer insulating layer ILD adjacent to each other in the Z-axis direction.

The dummy plug DPL may be formed in a structure similar to that of the cell plug CPL. As an embodiment, the dummy plug DPL may include a first dummy memory pattern DML1, a dummy channel layer DCH, a dummy core insulating layer DCO, and a second dummy memory pattern DML2.

The dummy channel layer DCH may pass through the gate stack GST and may extend into the first semiconductor layer 231 of the source structure 260. The dummy channel layer DCH may extend along a sidewall and a bottom surface of the dummy core insulating layer DCO. The dummy channel layer DCH and the dummy core insulating layer DCO may be overlapped by the gate separation structure 251.

The first dummy memory pattern DML1 may be disposed between the dummy channel layer DCH and the gate stack GST. The first dummy memory pattern DML1 may remain on a sidewall of the gate separation structure 251, but an embodiment of the present disclosure is not limited thereto. The second dummy memory pattern DML2 may be disposed between the dummy channel layer DCH and the first semiconductor layer 231 of the source structure 260. The first dummy memory pattern DML1 and the second dummy memory pattern DML2 may be separated from each other by the interlayer semiconductor layer 263 of the source structure 260.

The plurality of conductive patterns CP may be used as the first drain select line DSL1, the second drain select line DSL2, the plurality of word lines WL, and the source select line SSL shown in FIG. 2. As an embodiment, among the plurality of conductive patterns CP, at least one layer adjacent to the source structure 260 may be used as the source select line SSL shown in FIG. 2. Among the plurality of conductive patterns CP, conductive patterns separated from each other in the horizontal direction by the gate separation structure 251 may be used as the first drain select line DSL1 and the second drain select line DSL2 shown in FIG. 2. Among the plurality of conductive patterns CP, conductive patterns disposed between each of the first drain select line DSL1 and the second drain select line DSL2 and the source select line SSL may be used as the word lines WL.

According to the above-described structure, the memory cell MC shown in FIG. 2 may be defined at an intersection of the channel layer CH and the conductive pattern CP used as the word line. In addition, the drain select transistor DST shown in FIG. 2 may be defined at an intersection of the channel layer CH and the conductive pattern CP used as the first drain select line or the second drain select line. In addition, the source select transistor SST shown in FIG. 2 may be defined at an intersection of the channel layer CH and the conductive pattern CP used as the source select line.

The source select transistor SST, the memory cell MC, and the drain select transistor DST may be connected in series by the channel layer CH, and may configure the memory cell string CS.

Figure 6:
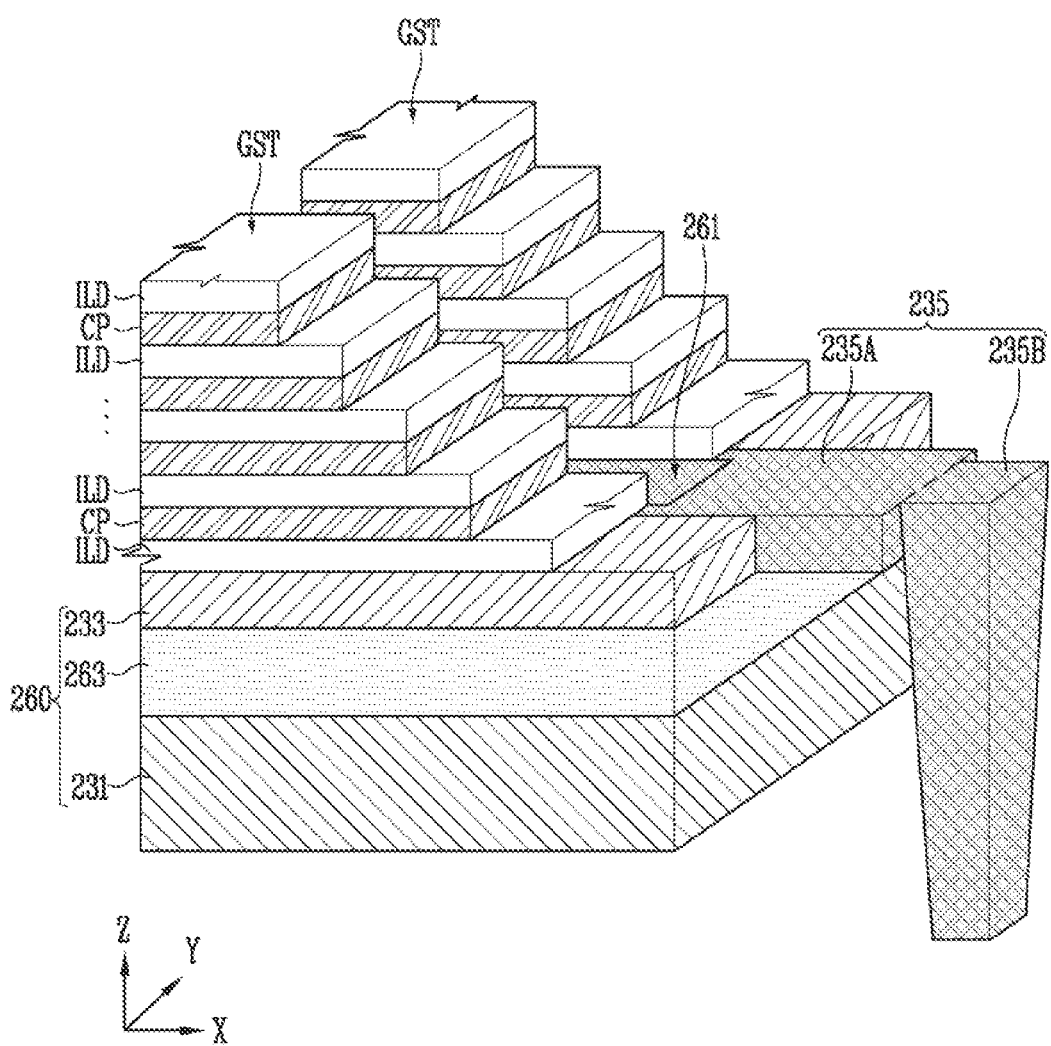
FIG. 6 is a perspective view of an A region shown in FIG. 4.

The interlayer insulating layers ILD and the plurality of conductive patterns CP of the gate stack GST may form a step structure as shown in FIG. 6. The step structure of the gate stack GST may be formed in the contact region CTR shown in FIG. 4. The step structure of the gate stack GST may be covered with an upper insulating layer 253.

The upper insulating layer 253 may be passed through by the slit 261 and the vertical structure 270. The upper insulating layer 253 may extend to overlap the third region AR3 of the semiconductor substrate 201.

The upper insulating layer 253 and the gate stack GST may be passed through by the filling insulating layer 255. The filling insulating layer 255 may overlap the second source insulating pattern 230B. The filling insulating layer 255 may be passed through by the upper contact 277. The upper contact 277 may be in contact with the lower contact 237 and may be connected to the second interconnection IC2 through the lower contact 237. The vertical structure 270 may have a sidewall facing the upper insulating layer 253.

The lower contact 237 may be formed using a process of forming the metal structure 235 and may include the same conductive material as the metal structure 235. The metal structure 235 may include a metal of which a work function is greater than that of the source structure 260. As an embodiment, the metal structure 235 may include tungsten. A charge generated while the semiconductor memory device is manufactured may be discharged to the discharge region 201DI of the semiconductor substrate 201 through the metal structure 235 of which the work function is greater than that of the first semiconductor layer 231 and the second semiconductor layer 233 of the source structure 260.

FIG. 6 is a perspective view of an A region shown in FIG. 4. Specifically, FIG. 6 is a perspective view of the gate stacks GST, the source structure 260, the metal structure 235, and the slit 261.

Referring to FIG. 6, the source structure 260 and the horizontal pattern 235A of the metal structure 235 may protrude in the horizontal direction than the gate stack GST formed in the step structure.

The horizontal pattern 235A of the metal structure 235 may be formed to have a width wider than that of the slit 261. The horizontal pattern 235A may protrude further than the source structure 260 toward the vertical pattern 235B in a length direction. As an embodiment, a width direction of the horizontal pattern 235A may be the Y-axis direction, and the length direction of the horizontal pattern 235A may be the X-axis direction.

A portion of the horizontal pattern 235A remaining on both sides of the slit 261 may be interposed between the gate stack GST and the interlayer semiconductor layer 263 of the source structure 260.

The vertical pattern 235B of the metal structure 235 may be spaced apart from each of the first semiconductor layer 231, the interlayer semiconductor layer 263, and the second semiconductor layer 233 of the source structure 260. Accordingly, a phenomenon in which the vertical pattern 235B is damaged while a process of forming the interlayer semiconductor layer 263 is in progress may be improved.

Hereinafter, a method of manufacturing a semiconductor memory device according to an embodiment of the present disclosure is described with reference to FIGS. 7A to 7C, 8A to 8C, 9, 10A to 10C, 11A to 11C, 12, 13A to 13C, 14A to 14C, 15A to 15C, 16A to 16C, and FIGS. 17A to 17C.

Hereinafter, a repetitive description of the same configuration as that shown in FIGS. 3, 4, and 5A to 5C is omitted.

Figure 7A:
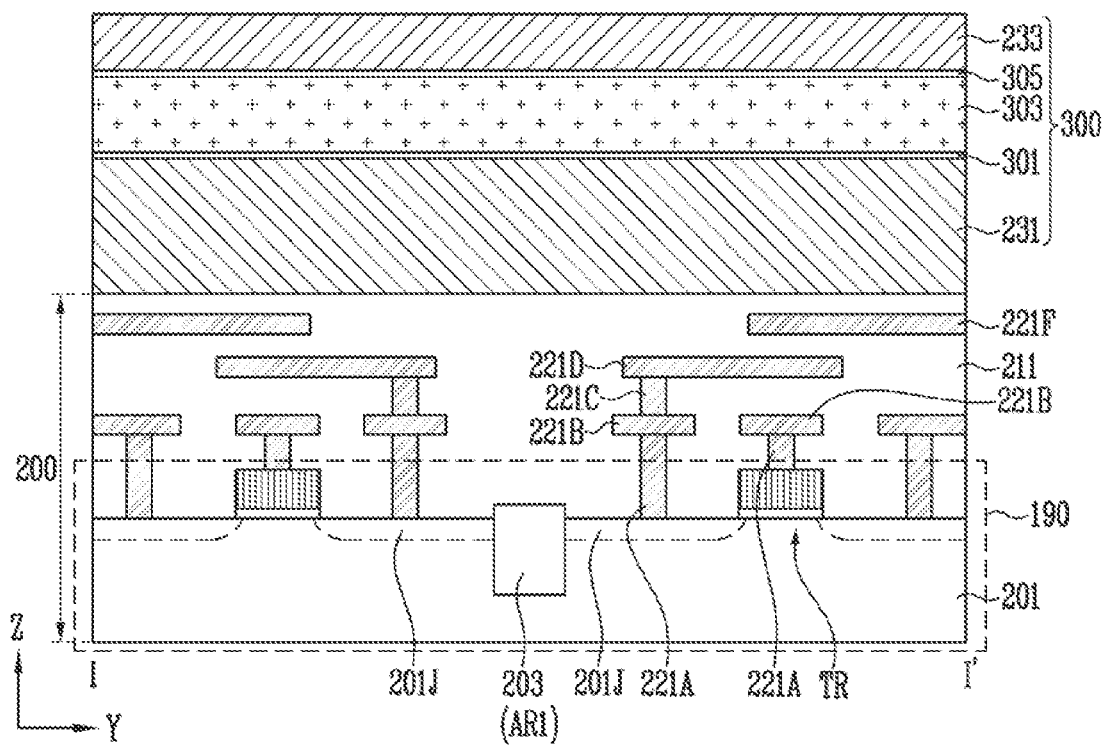
FIGS. 7A, 7B, and 7C are cross-sectional views illustrating a step of forming a source stack and a step of etching the source stack.
Figure 7B:
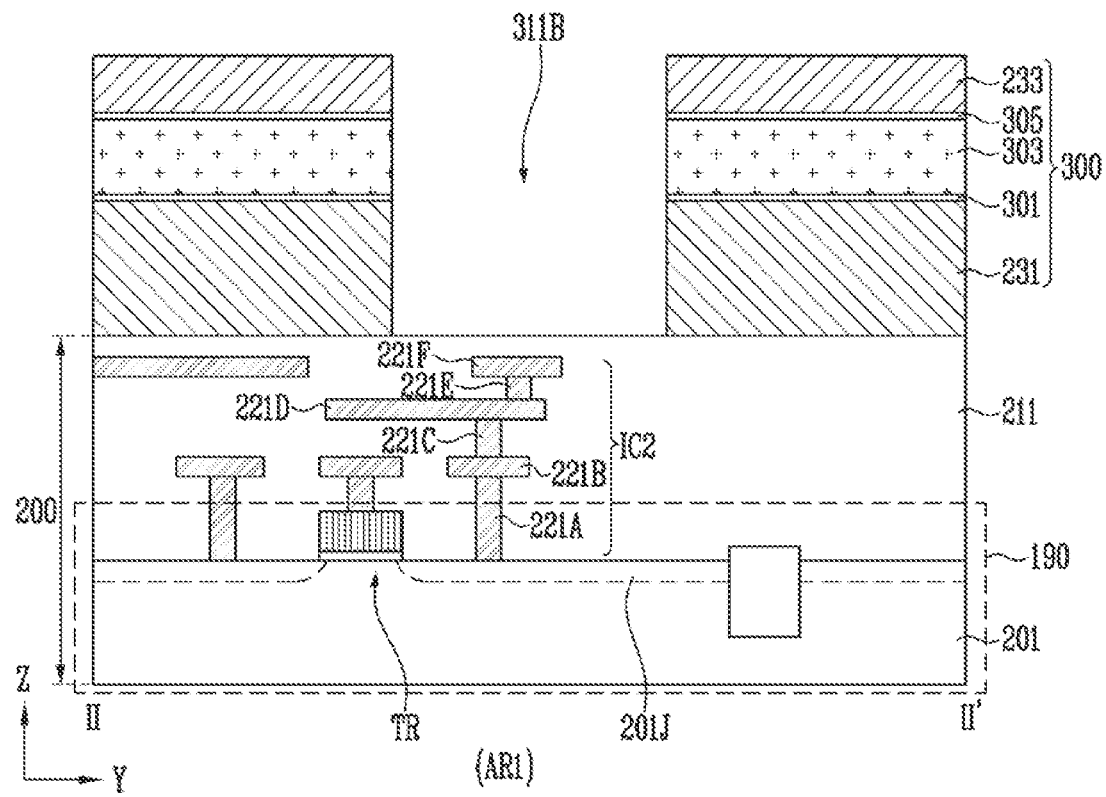
Figure 7C:
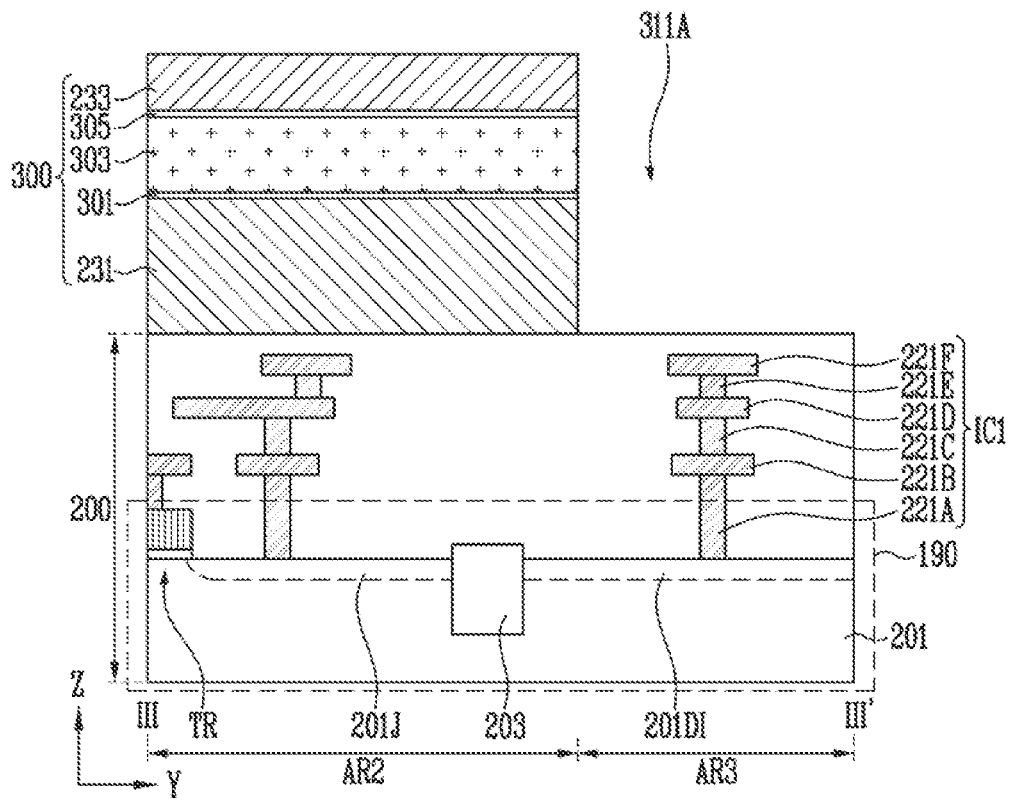

FIGS. 7A, 7B, and 7C are cross-sectional views illustrating a step of forming a source stack and a step of etching the source stack.

Referring to FIGS. 7A to 7C, the source stack 300 may be formed on a lower structure 200. The lower structure 200 may include the peripheral circuit structure 190, the lower insulating structure 211 covering the peripheral circuit structure 190, and the first interconnection IC1 and the second interconnection IC2 buried in the lower insulating structure 211.

The peripheral circuit structure 190 may include the discharge region 201DI, and a plurality of transistors TR formed in the semiconductor substrate 201 including the first region AR1, the second region AR2, and the third region AR3. A plurality of isolation layers 203 formed in the semiconductor substrate 201 may insulate the junctions 201J of the transistors TR adjacent to each other, or may insulate at least one junction 201J and the discharge region 201DI adjacent to the at least one junction 201J from each other.

The junctions 201J may be formed in the first region AR1 and the second region AR2 of the semiconductor substrate 201. The discharge region 201DI may be formed in the third region AR3 of the semiconductor substrate 201.

The lower insulating structure 211 may be formed to cover the semiconductor substrate 201 and the plurality of transistors TR. The plurality of conductive patterns 221A, 221B, 221C, 221D, 221E, and 221F configuring each of the first interconnection IC1 and the second interconnection IC2 may be buried in the lower insulating structure 211. The plurality of conductive patterns 221A, 221B, 221C, 221D, 221E, and 221F connected to the discharge region 201DI and configuring the first interconnection IC1 may be insulated from the plurality of conductive patterns 221A, 221B, 221C, 221D, 221E, and 221F connected to the junction 201I and configuring the second interconnection IC2 by the lower insulating structure 211.

The source stack 300 may include the first semiconductor layer 231, the first protective layer 301, the sacrificial layer 303, the second protective layer 305, and the second semiconductor layer 233 sequentially stacked on the lower structure 200. The sacrificial layer 303 may include silicon. For example, the sacrificial layer 303 may include undoped silicon. The first semiconductor layer 231 and the second semiconductor layer 233 may include an impurity of a conductivity type different from that of the discharge region 201DI. The first protective layer 301 and the second protective layer 305 may include a material having an etch selectivity with respect to the sacrificial layer 303. As an embodiment, the first protective layer 301 and the second protective layer 305 may include an oxide layer.

Subsequently, the source stack 300 may be etched to form a first opening 311A and a second opening 311B. The first opening 311A may overlap the first interconnection IC1 in the third region AR3 of the semiconductor substrate 201. The second opening 311B may overlap the second interconnection IC2 in the first region AR1 of the semiconductor substrate 201. The first opening 311A may be defined as a line type, and the second opening 311B may be defined as a hole type. Each of the first opening 311A and the second opening 311B may pass through the source stack 300 and expose the lower insulating structure 211.

Figure 8A:
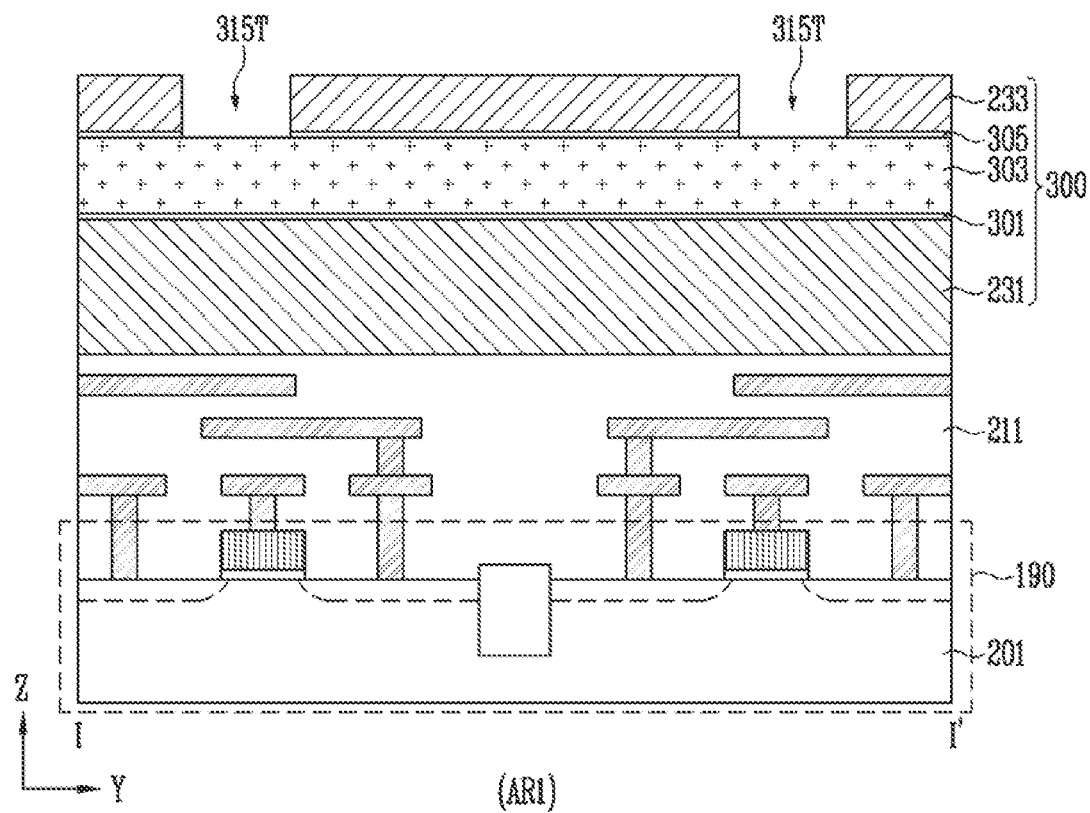
FIGS. 8A, 8B, and 8C are cross-sectional views illustrating a step of forming source insulating patterns and a recess.
Figure 8B:
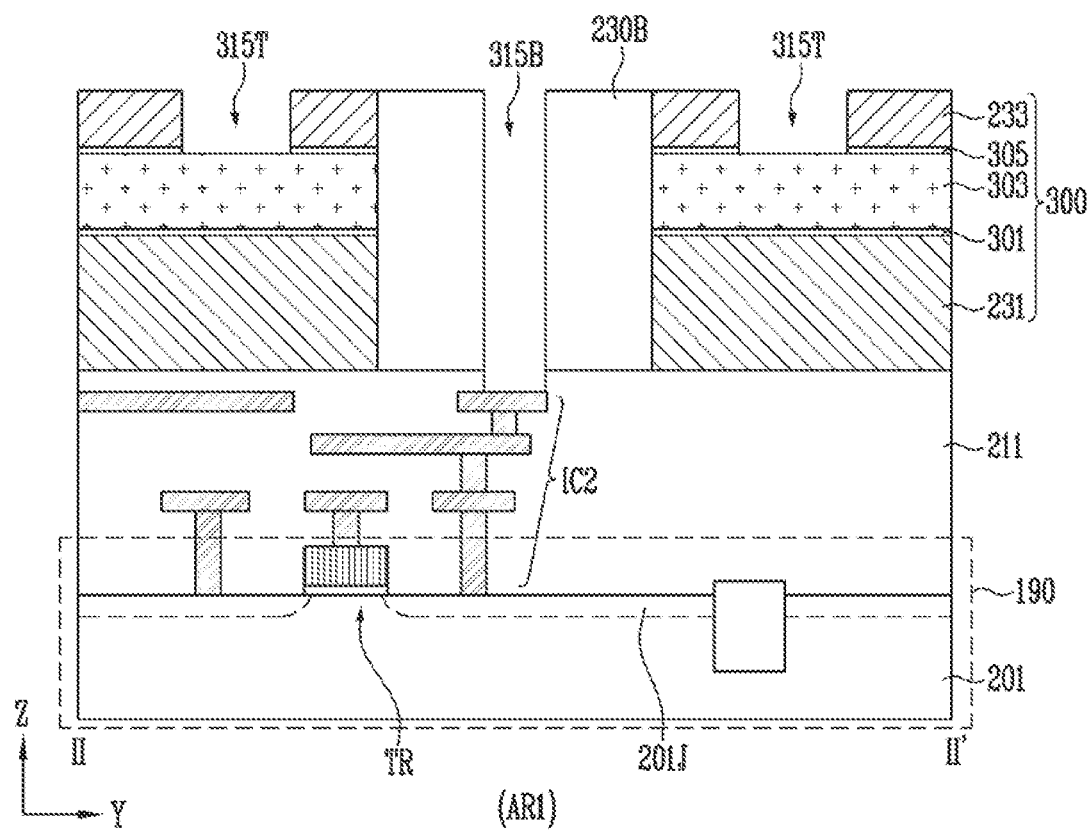
Figure 8C:
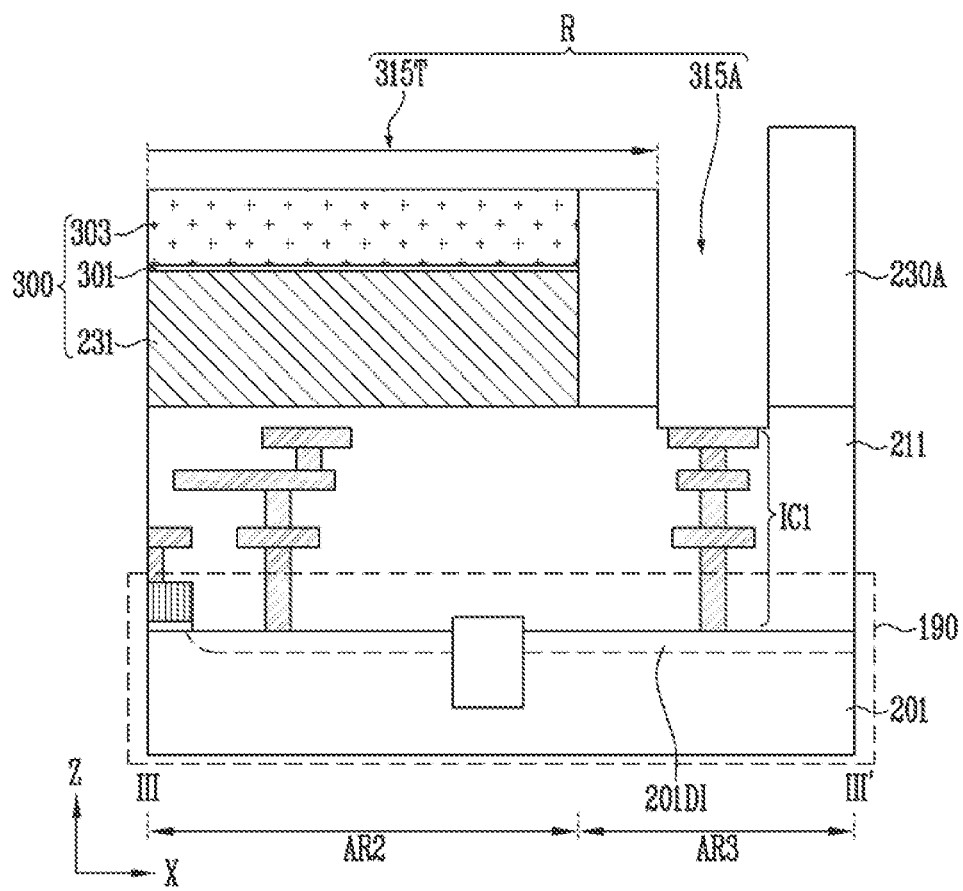

FIGS. 8A, 8B, and 8C are cross-sectional views illustrating a step of forming source insulating patterns and a recess.

Referring to FIGS. 8A to 8C, the source insulating patterns 230A and 230B may be formed by filling the first opening 311A shown in FIG. 7C and the second opening 311B shown in FIG. 7B with an insulating material. The source insulating patterns 230A and 230B may include the first source insulating pattern 230A filling the first opening 311A shown in FIG. 7C and the second source insulating pattern 230B filling the second opening 311B shown in FIG. 7B. The first source insulating pattern 230A may pass through the source stack 300 in the third region AR3 of the semiconductor substrate 201 and overlap the first interconnection IC1. The second source insulating pattern 230B may pass through the source stack 300 in the first region AR1 of the semiconductor substrate 201 and overlap the second interconnection IC2.

Subsequently, a first contact hole 315A passing through the first source insulating pattern 230A and a second contact hole 315B passing through the second source insulating pattern 230B may be formed using the same mask process. The first contact hole 315A may overlap the first interconnection IC1 and may extend into the lower insulating structure 211 to expose the first interconnection IC1. The second contact hole 315B may overlap the second interconnection IC2 and may extend into the lower insulating structure 211 to expose the second interconnection IC2.

Thereafter, the trench 315T may be formed to be connected to the first contact hole 315A and extend into the source stack 300. The trench 315T may be defined by etching a portion of the second semiconductor layer 233 of the source stack 300 and a portion of the first source insulating pattern 230A. The trench 315T may be provided for the horizontal pattern 235A of the metal structure 235 shown in FIG. 9.

The recess R, that is defined by a connection structure of the first contact hole 315A and the trench 315T, and the second contact hole 315B may be formed by the above-described process.

Figure 9:
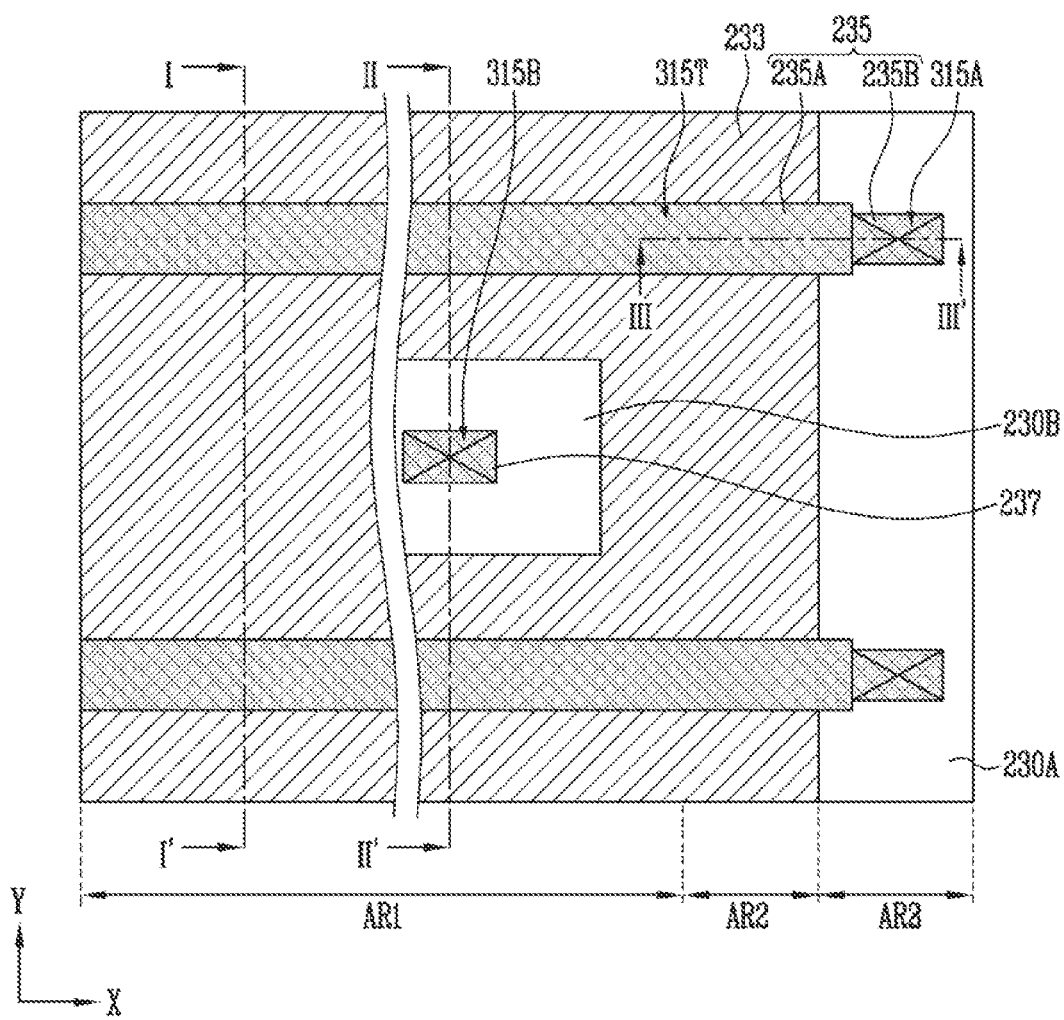
FIGS. 9, 10A, 10B, and 10C are views illustrating a step of forming a metal structure and a lower contact.
Figure 10A:
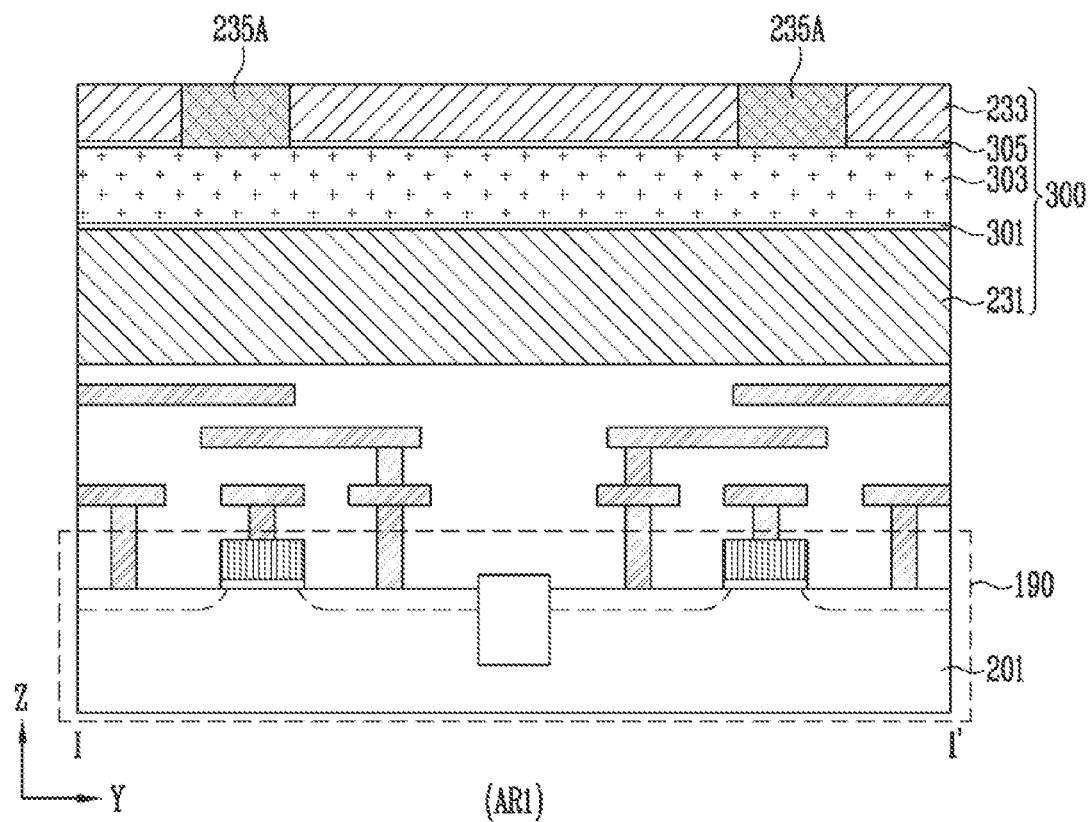
Figure 10B:
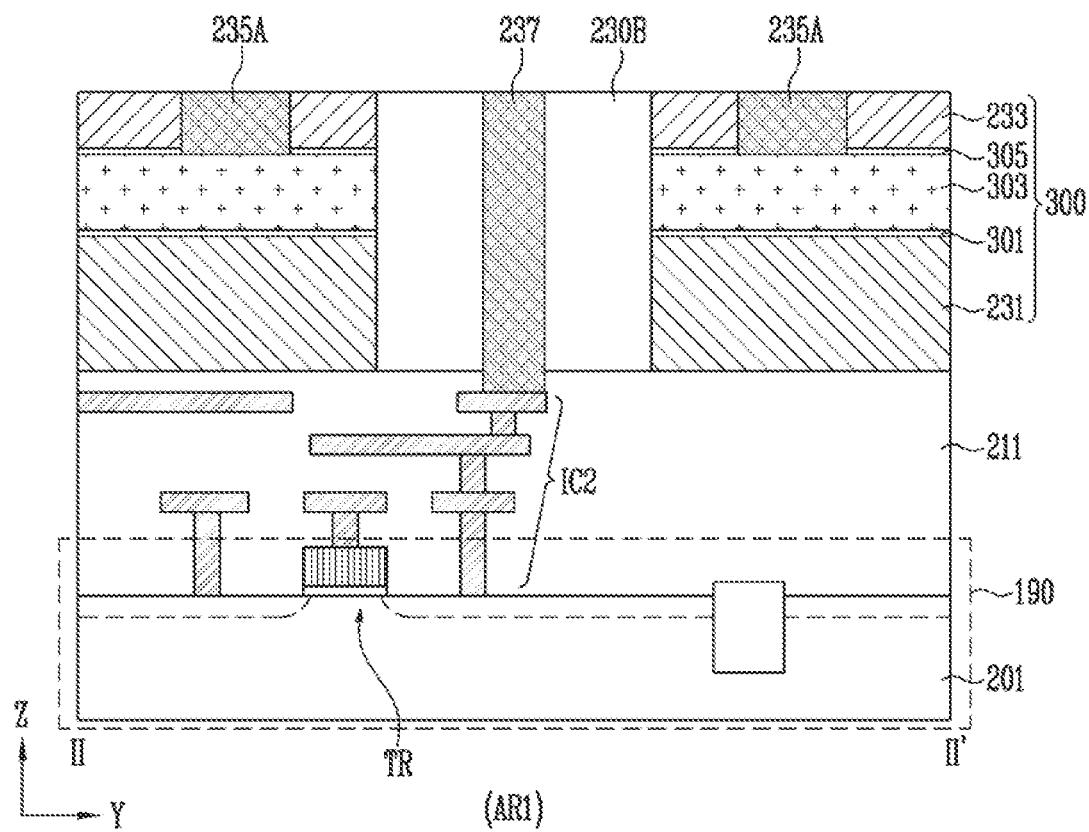
Figure 10C:
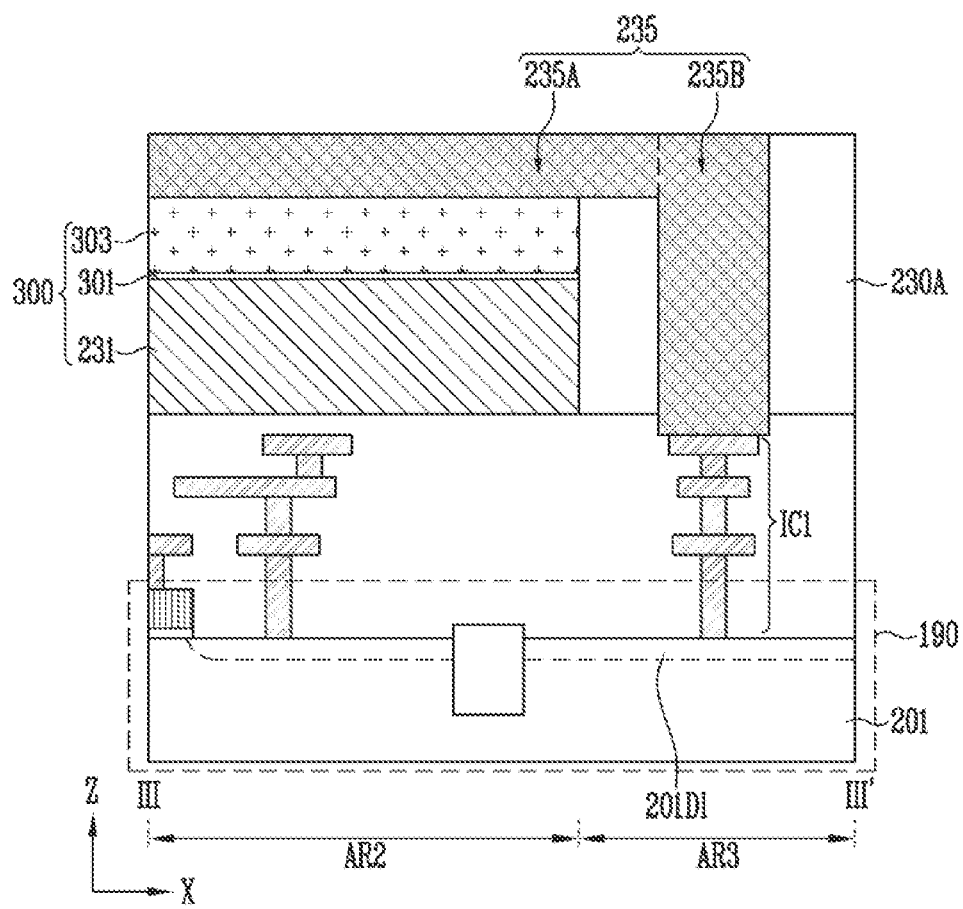

FIGS. 9, 10A, 10B, and 10C are views illustrating a step of forming the metal structure and the lower contact. FIG. 9 is a plan view of the metal structure 235, and FIGS. 10A to 10C are process cross-sectional views illustrating intermediate process result shown in FIG. 9 taken along the line I-I', the line II-II', and the line III-III'.

Referring to FIGS. 9, 10A, 10B, and 10C, the horizontal pattern 235A of the metal structure 235 may be formed in the trench 315T. In an embodiment, referring to FIGS. 9, 10A, 10B, and 10C, the horizontal pattern 235A of the metal structure 235 may fill the trench 315T. The horizontal pattern 235A may pass through the second semiconductor layer 233 overlapping the first region AR1 and the second region AR2 of the semiconductor substrate 201. The horizontal pattern 235A may protrude further than the source stack 300 in the horizontal direction to overlap the third region AR3 of the semiconductor substrate 201.

The vertical pattern 235B of the metal structure 235 may be formed in the first contact hole 315A. In an embodiment, the vertical pattern 235B of the metal structure 235 may fill the first contact hole 315A. The vertical pattern 235B may be connected to the horizontal pattern 235A and may be in contact with the first interconnection IC1. The vertical pattern 235B may be connected to the discharge region 201DI through the first interconnection IC1.

The lower contact 237 may be formed in the second contact hole 315B, by using the process of forming the metal structure 235 described above. The lower contact 237 may be in contact with the second interconnection IC2. The lower contact 237 may be connected to the transistor TR through the second interconnection IC2. In an embodiment, the lower contact 237 filling the second contact hole 315B may be formed, by using the process of forming the metal structure 235 described above.

A metal of which a work function is greater than that of the second semiconductor layer 233 may be formed in the trench 315T, the first contact hole 315A, and the second contact hole 315B. Accordingly, the metal structure 235 and the lower contact 237 may be formed in the trench 315T, the first contact hole 315A, and the second contact hole 315B. As an embodiment, the metal for the metal structure 235 and the lower contact 237 may be tungsten. Before forming tungsten for the metal structure 235 and the lower contact 237, a metal barrier layer such as a titanium nitride layer may be further formed. In an embodiment, the metal structure 235 and the lower contact 237 may be formed by filling the trench 315T, the first contact hole 315A, and the second contact hole 315B with a metal. In an embodiment, the metal may have a work function which is greater than that of the second semiconductor layer 233. As an embodiment, the metal structure 235 and the lower contact 237 may be formed by filling the trench 315T, the first contact hole 315A, and the second contact hole 315B with tungsten.

Figure 11B:
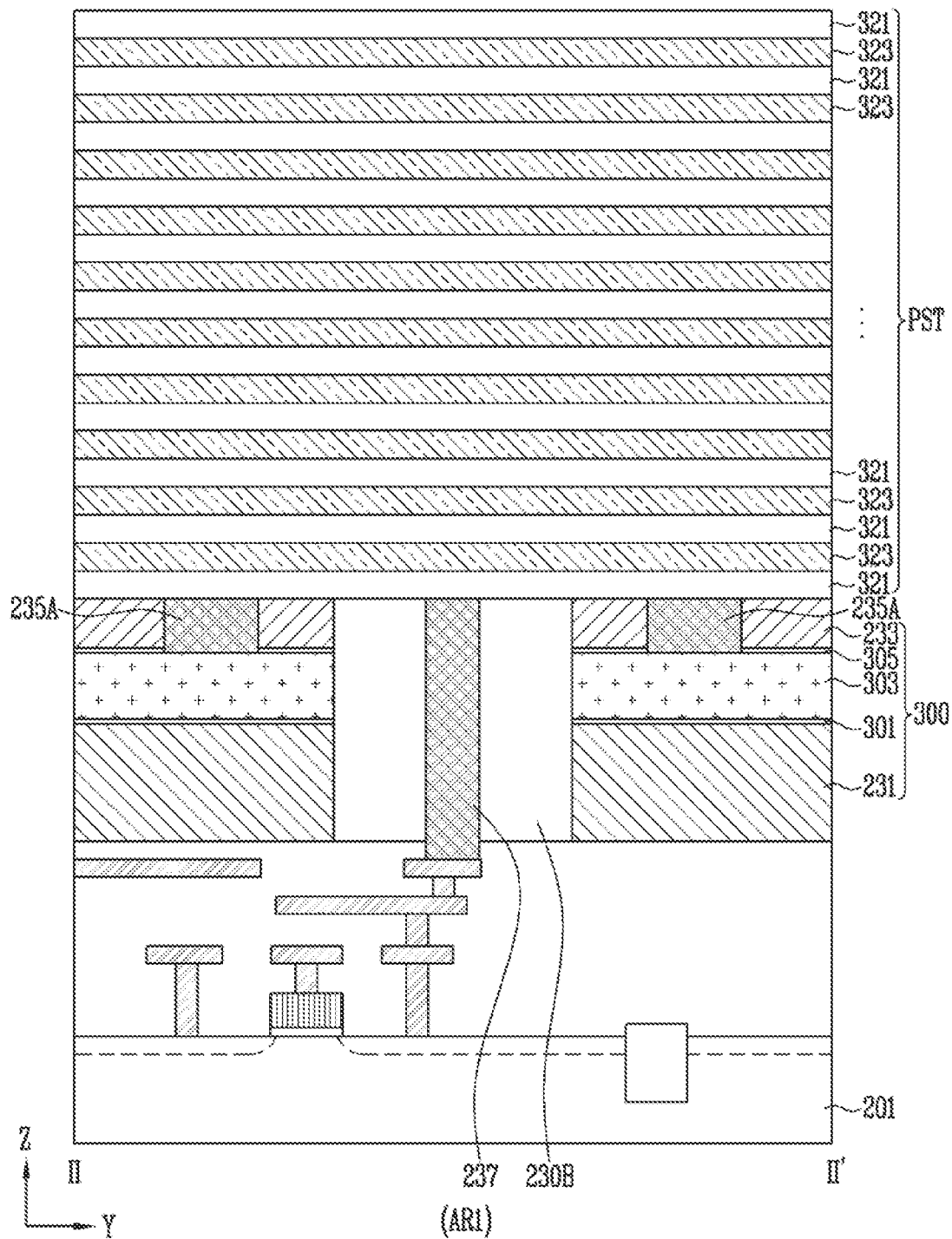
Figure 11C:
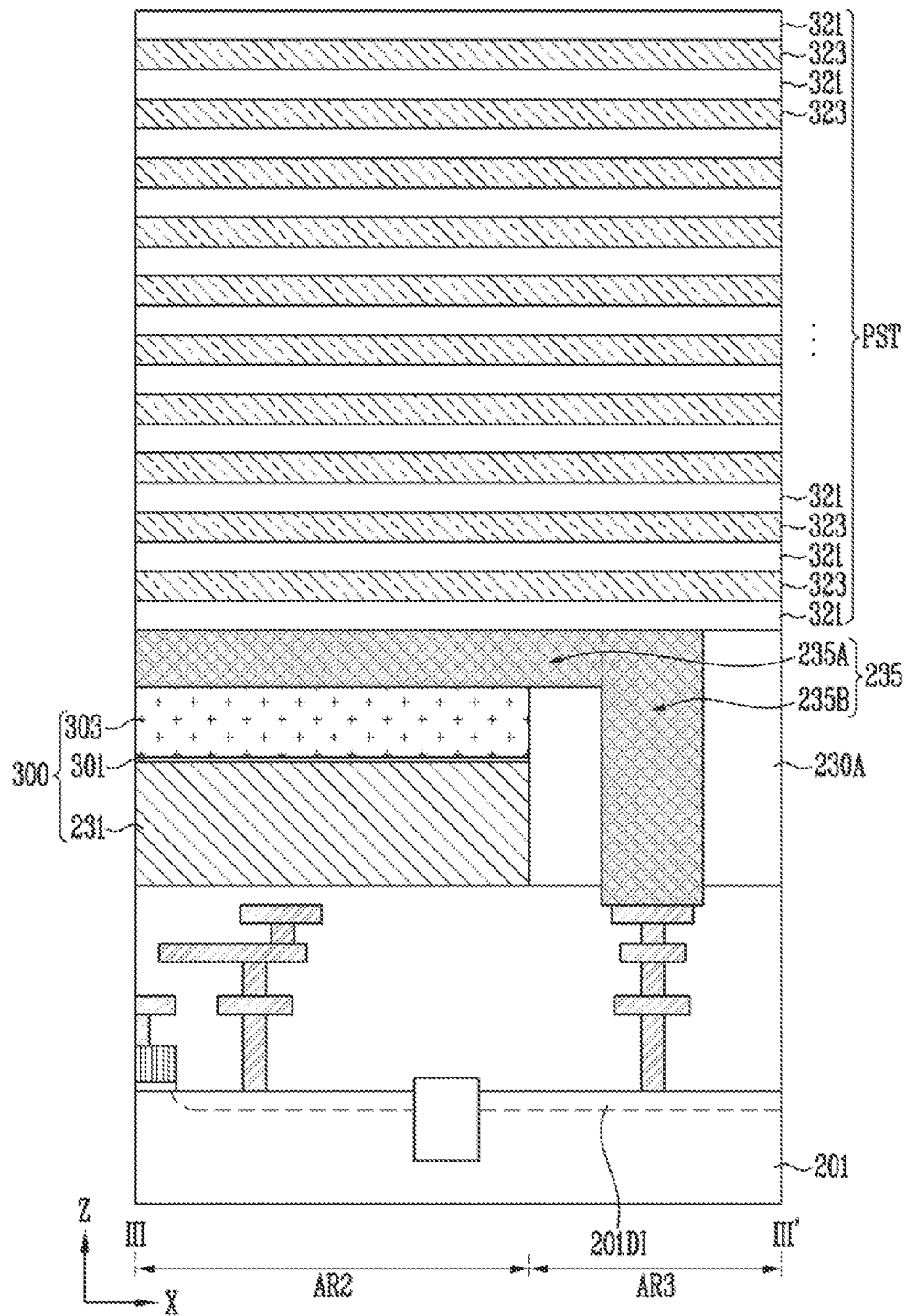

FIGS. 11A, 11B, and 11C are cross-sectional views illustrating a step of forming a preliminary gate stack and a step of forming the cell plugs.

Referring to FIGS. 11A to 11C, the preliminary gate stack PST may be formed, by alternately stacking a plurality of first material layers 321 and a plurality of second material layers 323 on the source stack 300. The plurality of first material layers 321 and the plurality of second material layers 323 may extend to overlap the metal structure 235, the lower contact 237, the first source insulating pattern 230A, and the second source insulating pattern 230B.

Each of the first material layers 321 may be provided as the interlayer insulating layer ILD shown in FIGS. 5A and 5B. Each of the second material layers 323 may include a material having an etch selectivity with respect to the first material layer 321. As an embodiment, the first material layer 321 may include an oxide such as a silicon oxide layer, and the second material layer 323 may include a nitride layer such as a silicon nitride layer. An etch selectivity of the metal structure 235 with respect to each of the first material layer 321 and the second material layer 323 of the preliminary gate stack PST may be higher than an etch selectivity of the source stack 300 with respect to each of the first material layer 321 and the second material layer 323 of the preliminary gate stack PST.

The plurality of cell plugs CPL may be formed on both sides of the horizontal pattern 235A of the metal structure 235. Forming the plurality of cell plugs CPL may include forming a channel hole H passing through the preliminary gate stack PST of the first material layer 321 and the second material layer 323, forming a memory layer ML along a surface of the channel hole H, forming a semiconductor layer along a surface of the memory layer ML, and filling a central region of the channel hole H opened by the semiconductor layer with the core insulating layer CO and a doped semiconductor layer. The semiconductor layer and the doped semiconductor layer inside the channel hole H may configure the channel layer CH. The memory layer ML may include a blocking insulating layer, a data storage layer, and a tunnel insulating layer, similarly to the first memory pattern ML1 and the second memory pattern ML2 described with reference to FIG. 5A.

The dummy plug DPL may be formed using a process of forming the cell plug CPL. As an embodiment, while the channel hole H is formed, a dummy hole DH may be formed. While the memory layer ML is formed, a dummy memory layer DML of the same configuration as the memory layer ML may be formed along a surface of the dummy hole DH. While the semiconductor layer is formed inside the channel hole H, the semiconductor layer may be formed inside the dummy hole DH. While the core insulating layer CO is formed, a dummy core insulating layer DCO of the same configuration as the core insulating layer CO may be formed inside the dummy hole DH. While the doped semiconductor layer is formed in the channel hole H, the doped semiconductor layer may be formed in the dummy hole DH. The semiconductor layer and the doped semiconductor layer inside the dummy hole DH may configure the dummy channel layer DCH.

The channel hole H and the dummy hole DH described above may extend into the first semiconductor layer 231 of the source stack 300. The channel layer CH and the memory layer ML of the cell plug CPL may extend into the first semiconductor layer 231 along the channel hole H. The dummy channel layer DCH and the dummy memory layer DML of the dummy plug DPL may extend into the first semiconductor layer 231 along a surface of the dummy hole DH.

In order to improve the integration degree of the semiconductor memory device, the number of stacks of the first material layer 321 and the second material layer 323 of the preliminary gate stack PST may be increased. As the number of stacks of the first material layer 321 and the second material layer 323 increases, during an etching process of the first material layer 321 and the second material layer 323 for forming the channel hole H and the dummy hole DH, high power may be applied to semiconductor manufacturing equipment. A charge may be accumulated in the source stack 300 by the high power applied to the semiconductor manufacturing equipment. While etching the first material layer 321 and the second material layer 323, a ground voltage may be applied to the discharge region 201DI of the semiconductor substrate 201 from a supporter (not shown) of the semiconductor manufacturing equipment. Accordingly, the charge accumulated in the source stack 300 may be discharged through the discharge region 201DI through the metal structure 235 having a work function higher than that of the source stack 300. Accordingly, the present disclosure may reduce an arcing phenomenon.

Figure 12:
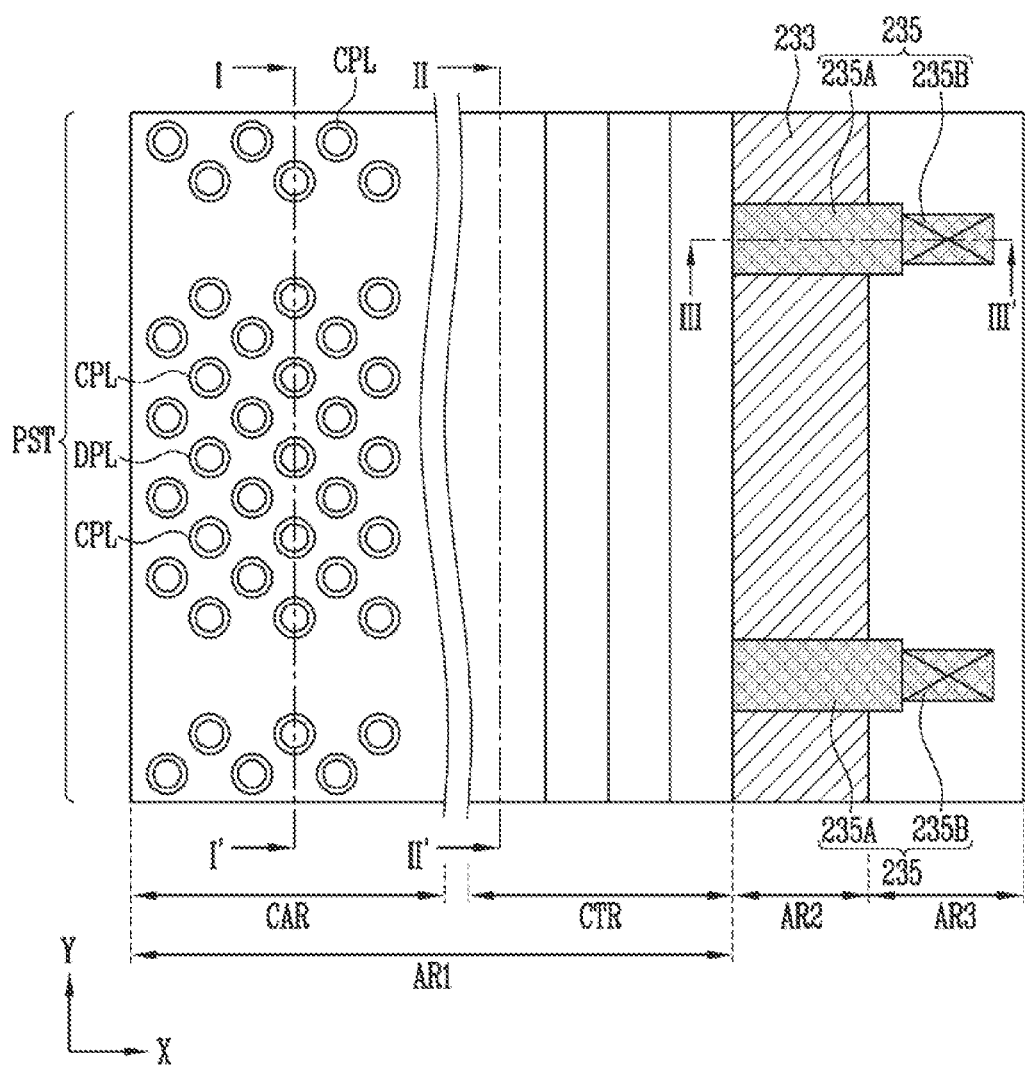
FIGS. 12, 13A, 13B, and 13C are cross-sectional views illustrating a step of forming a step structure.
Figure 13A:
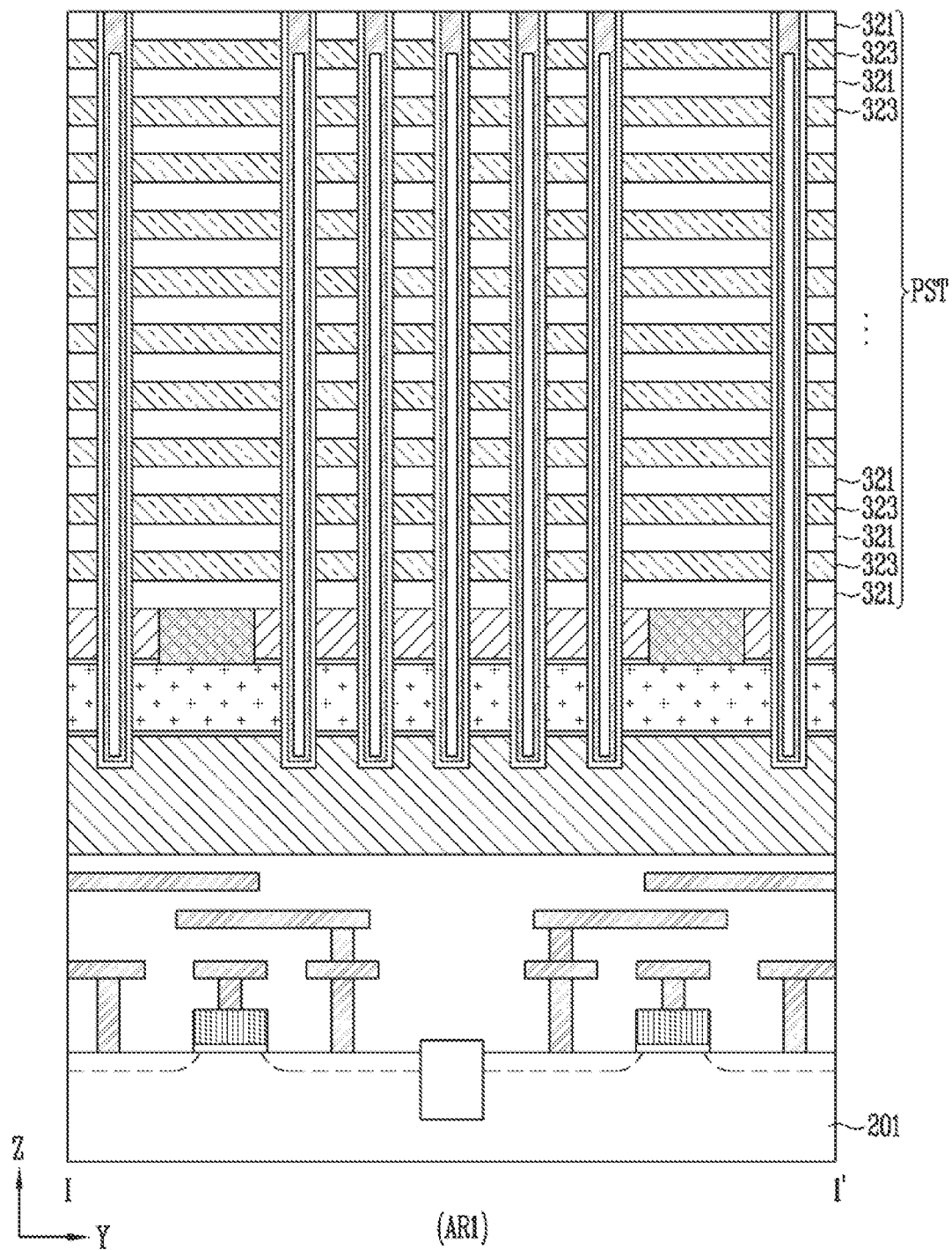
Figure 13B:
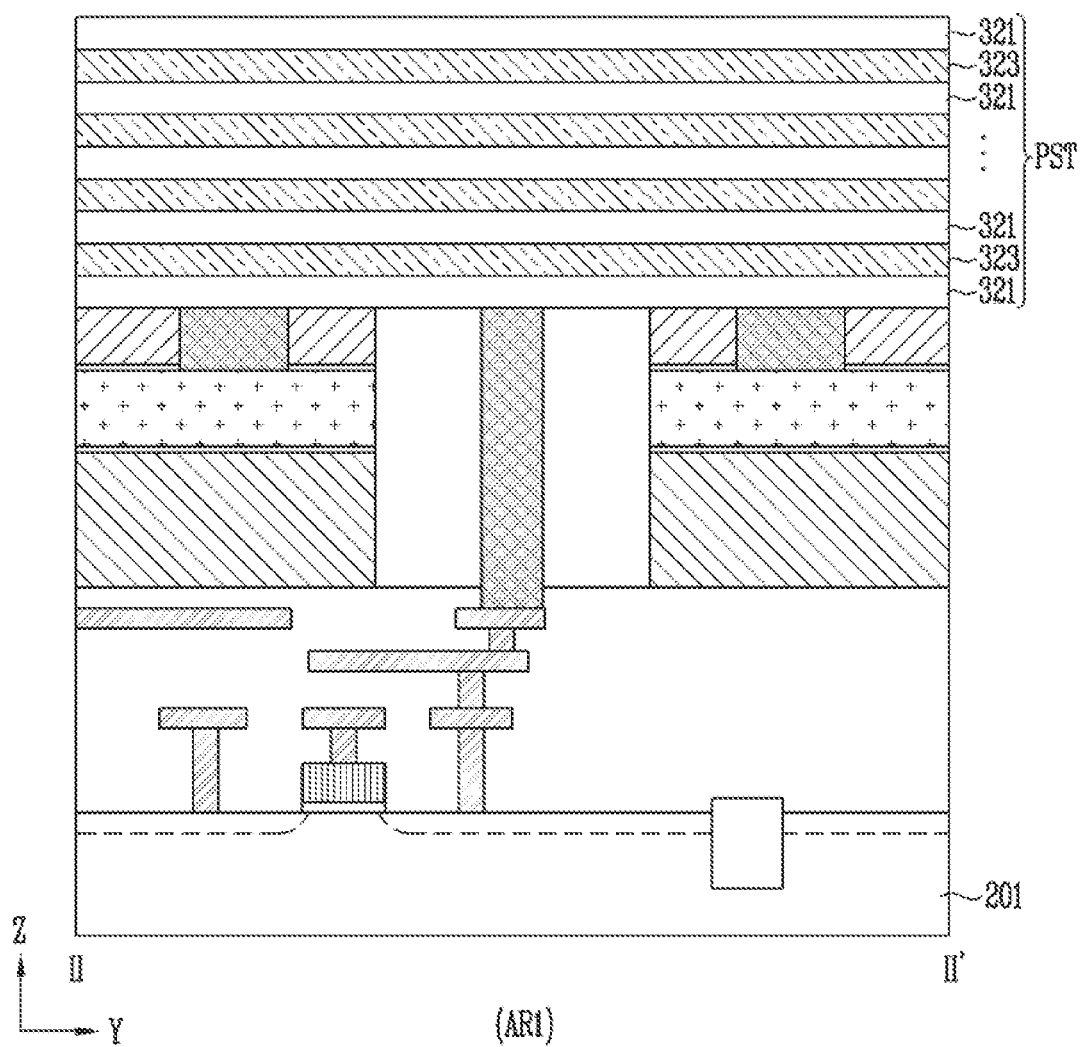
Figure 13C:
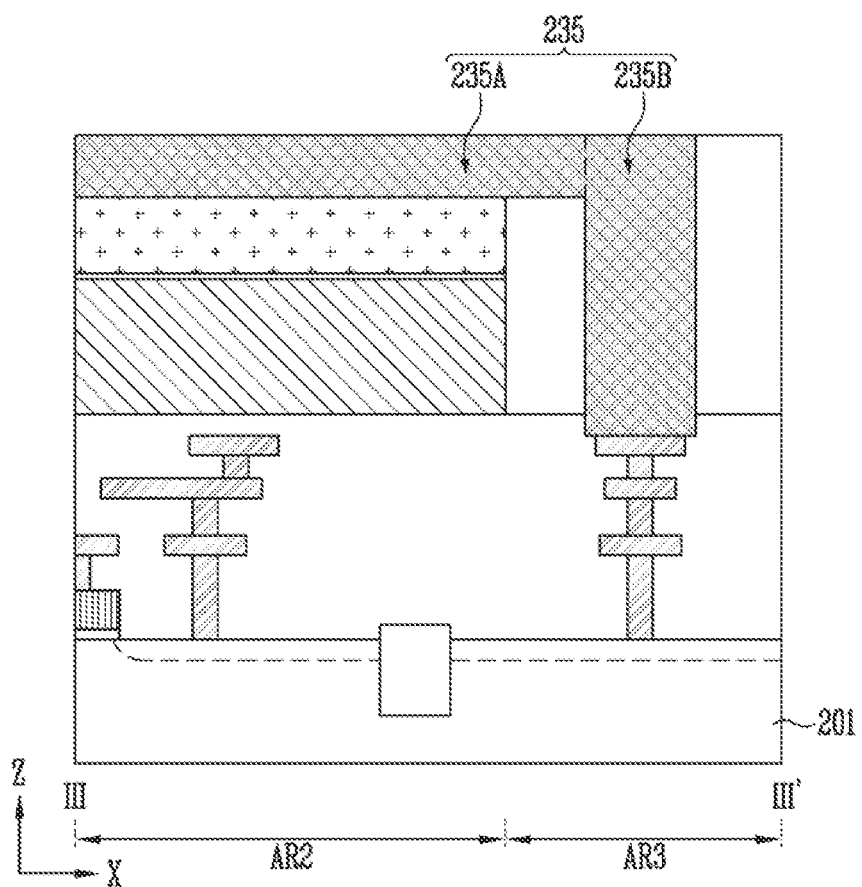

FIGS. 12, 13A, 13B, and 13C are cross-sectional views illustrating a step of forming a step structure. FIG. 12 is a plan view illustrating the step structure, and FIGS. 13A to 13C are cross-sectional views illustrating an intermediate process result shown in FIG. 12 taken along the line I-I', the line II-II', and the line III-III'.

Referring to FIGS. 12 and 13A to 13C, the preliminary gate stack PST may be etched to define the step structure on the first region AR1 of the semiconductor substrate 201. Accordingly, the contact region CTR and the cell array region CAR of the preliminary gate stack PST may be defined. The contact region CTR of the preliminary gate stack PST may be defined as a region having the step structure. The cell array region CAR of the preliminary gate stack PST may be defined as a region extending from the contact region CTR to surround the cell plug CPL and the dummy plug DPL.

A portion of the metal structure 235 overlapping the second region AR2 and the third region AR3 of the semiconductor substrate 201 may be opened while forming the step structure.

Figure 14A:
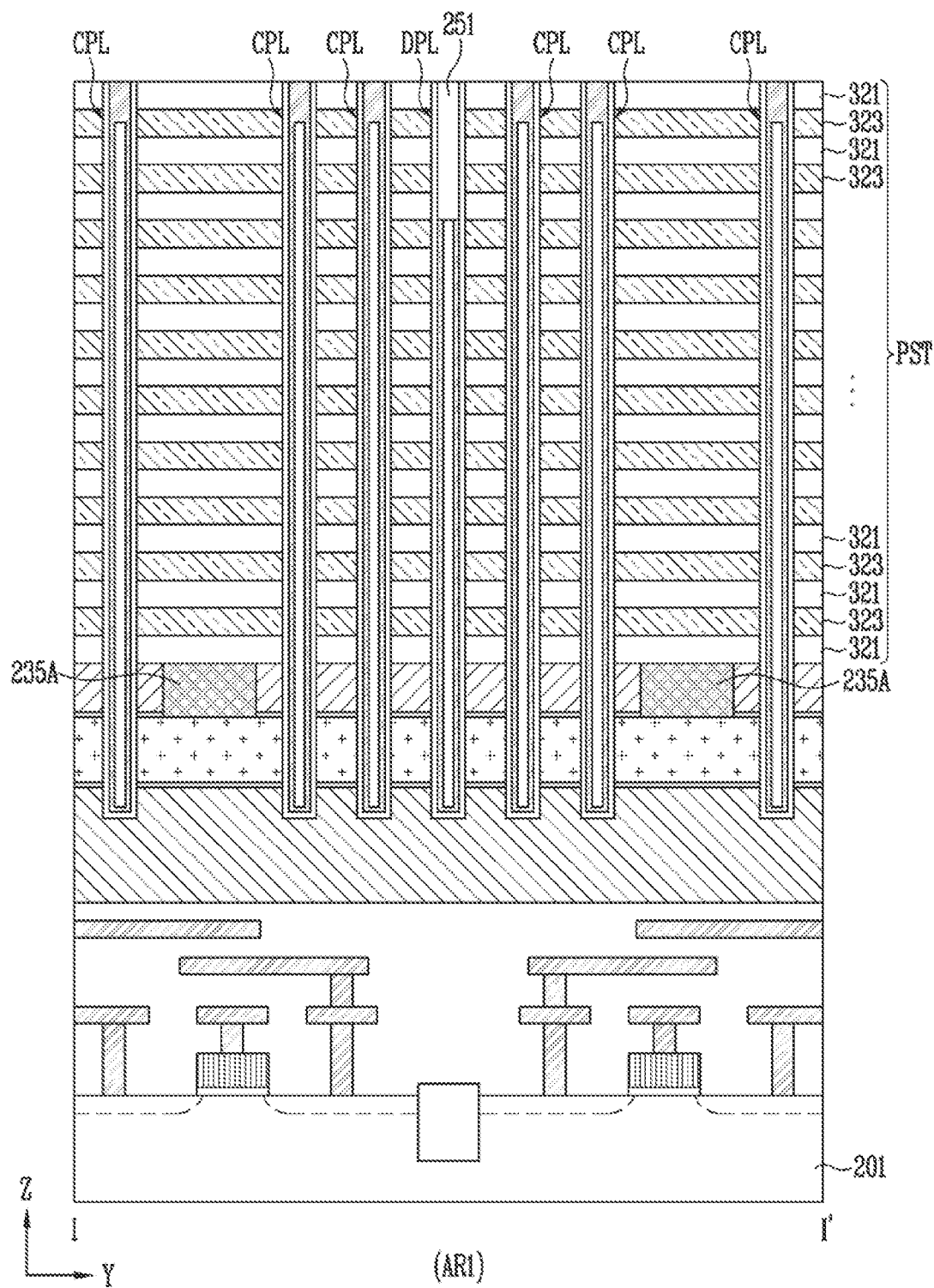
FIGS. 14A, 14B, and 14C are cross-sectional views illustrating a step of forming an upper insulating layer, a filling insulating layer, and a gate separation structure.
Figure 14B:
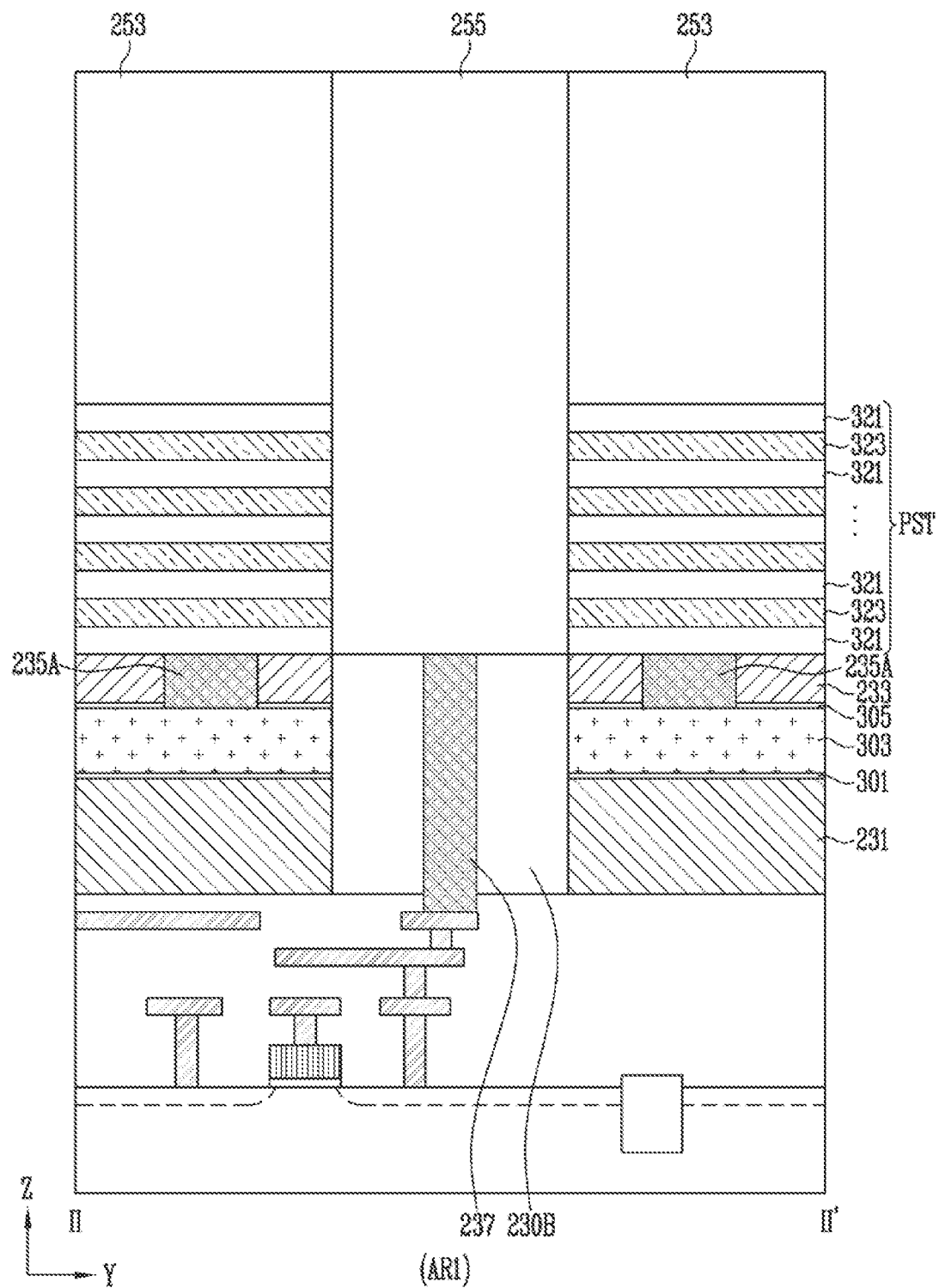
Figure 14C:
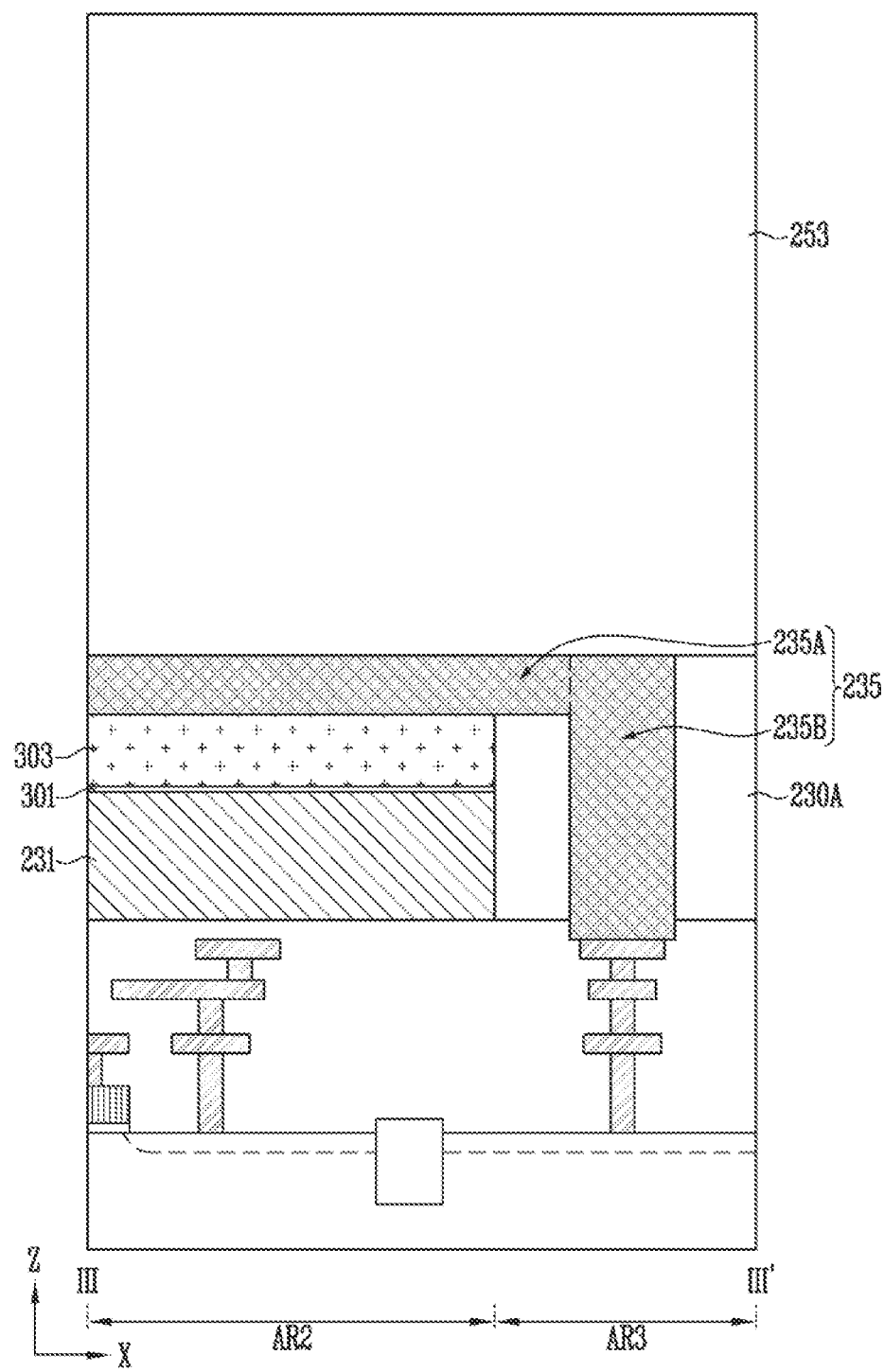

FIGS. 14A, 14B, and 14C are cross-sectional views illustrating a step of forming the upper insulating layer, the filling insulating layer, and the gate separation structure.

Referring to FIGS. 14A to 14C, the upper insulating layer 253 may be formed to cover the preliminary gate stack PST and the metal structure 235. Subsequently, the filling insulating layer 255 may be formed to pass through a portion of the preliminary gate stack PST overlapping the second source insulating pattern 230B and to pass through a portion of the upper insulating layer 253. The filling insulating layer 255 may overlap the lower contact 237.

Thereafter, the gate separation structure 251 may be formed by etching at least a pair of the first material layer 321 and the second material layer 323 disposed on the uppermost layer of the preliminary gate stack PST. The gate separation structure 251 may extend inside an upper end of the dummy plug DPL.

FIGS. 15A, 15B, 15C, 16A, 16B, 16C, 17A, 17B, and 17C are cross-sectional views illustrating replacement processes and a process of forming the conductive source contact.

Figure 15A:
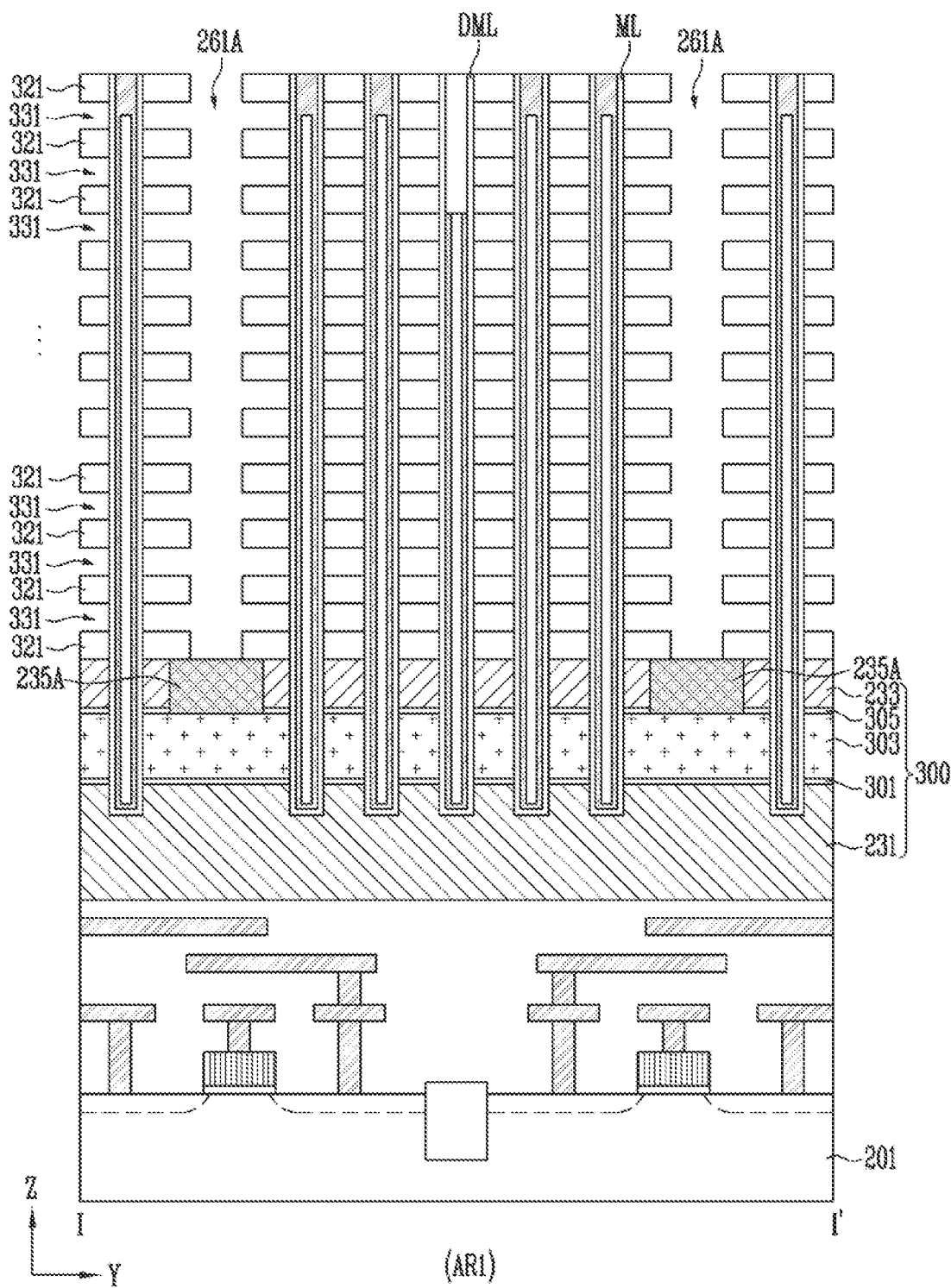
FIGS. 15A, 15B, 15C, 16A, 16B, 16C, 17A, 17B, and 17C are cross-sectional views illustrating replacement processes and a process of forming a conductive source contact.
Figure 15B:
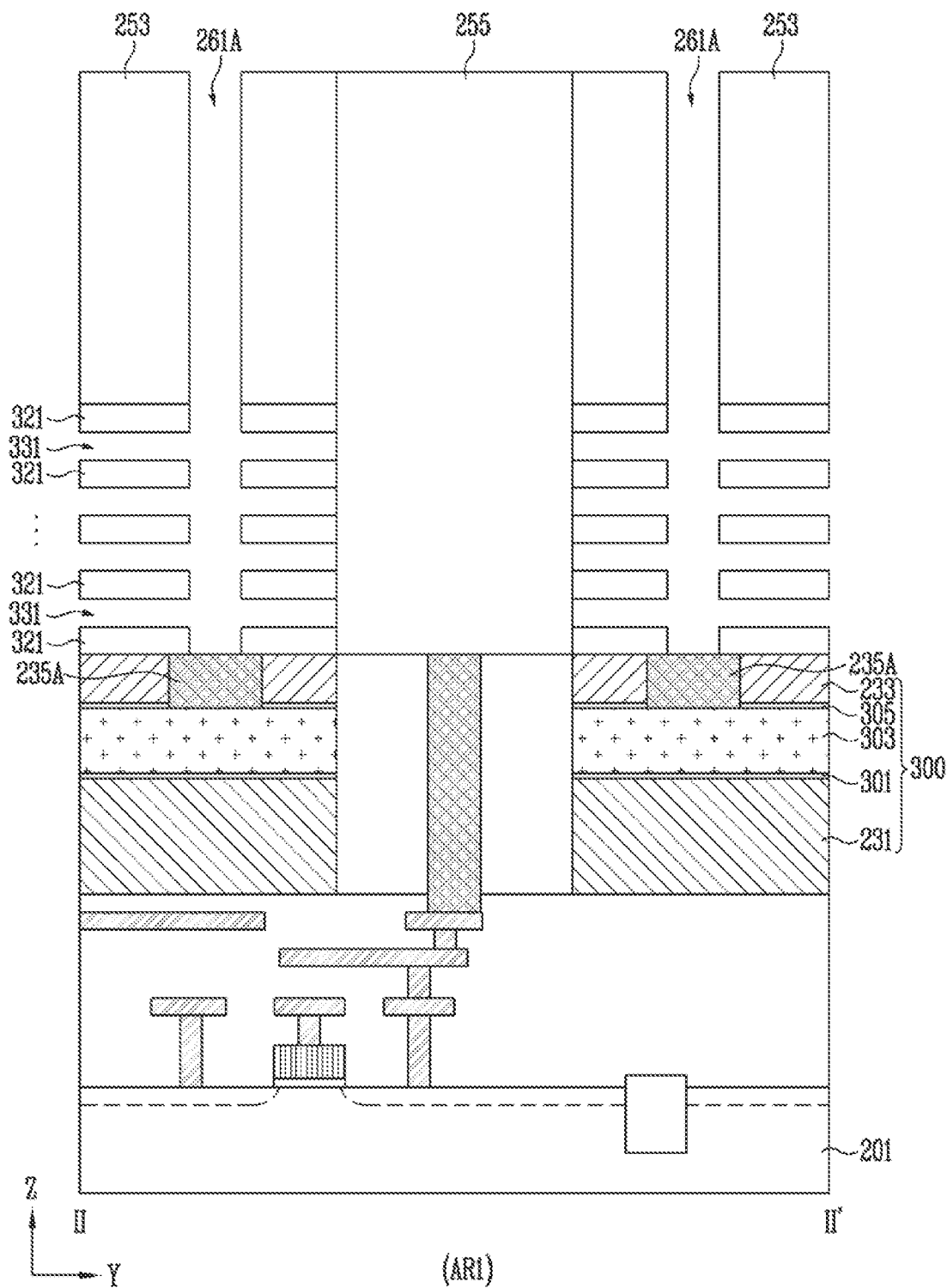
Figure 15C:
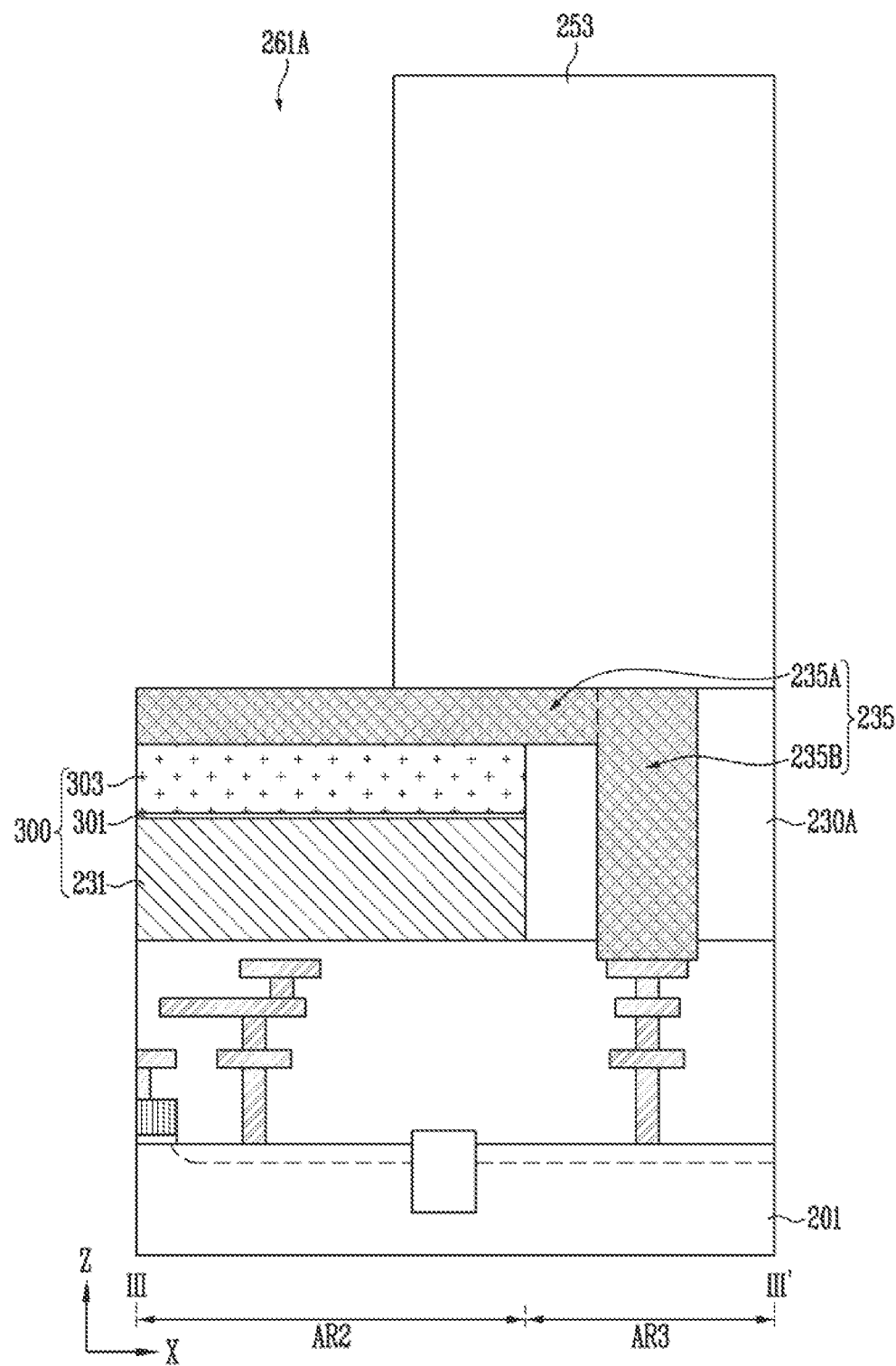

Referring to FIGS. 15A to 15C, a preliminary slit 261A may be formed to pass through the preliminary gate stack PST shown in FIGS. 14A and 14B. The preliminary slit 261A may overlap the horizontal pattern 235A of the metal structure 235. Because the metal structure 235 has a higher etch selectivity with respect to the preliminary gate stack PST than the source stack 300, the horizontal pattern 235A may be used as an etch stop layer. Accordingly, a phenomenon in which the preliminary slit 261A is excessively deep may be reduced. The preliminary slit 261A may extend to overlap the second region AR2 of the semiconductor substrate 201.

Subsequently, the plurality of second material layers 323 of the preliminary gate stack PST shown in FIGS. 14A and 14B may be selectively removed through the preliminary slit 261A. Accordingly, a plurality of gate regions 331 may be opened between the first material layers 321 adjacent in the Z-axis direction.

Figure 16A:
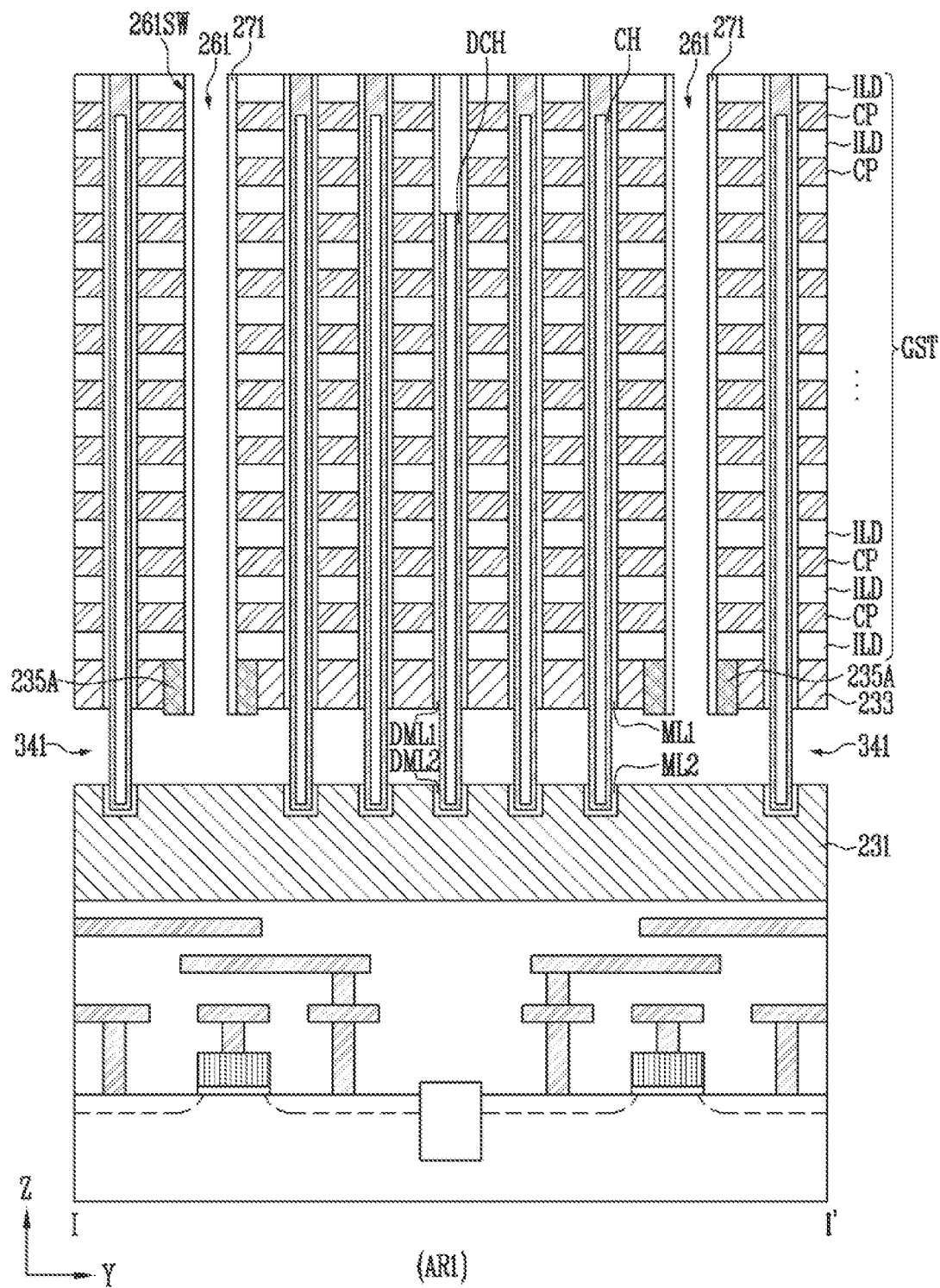
Figure 16B:
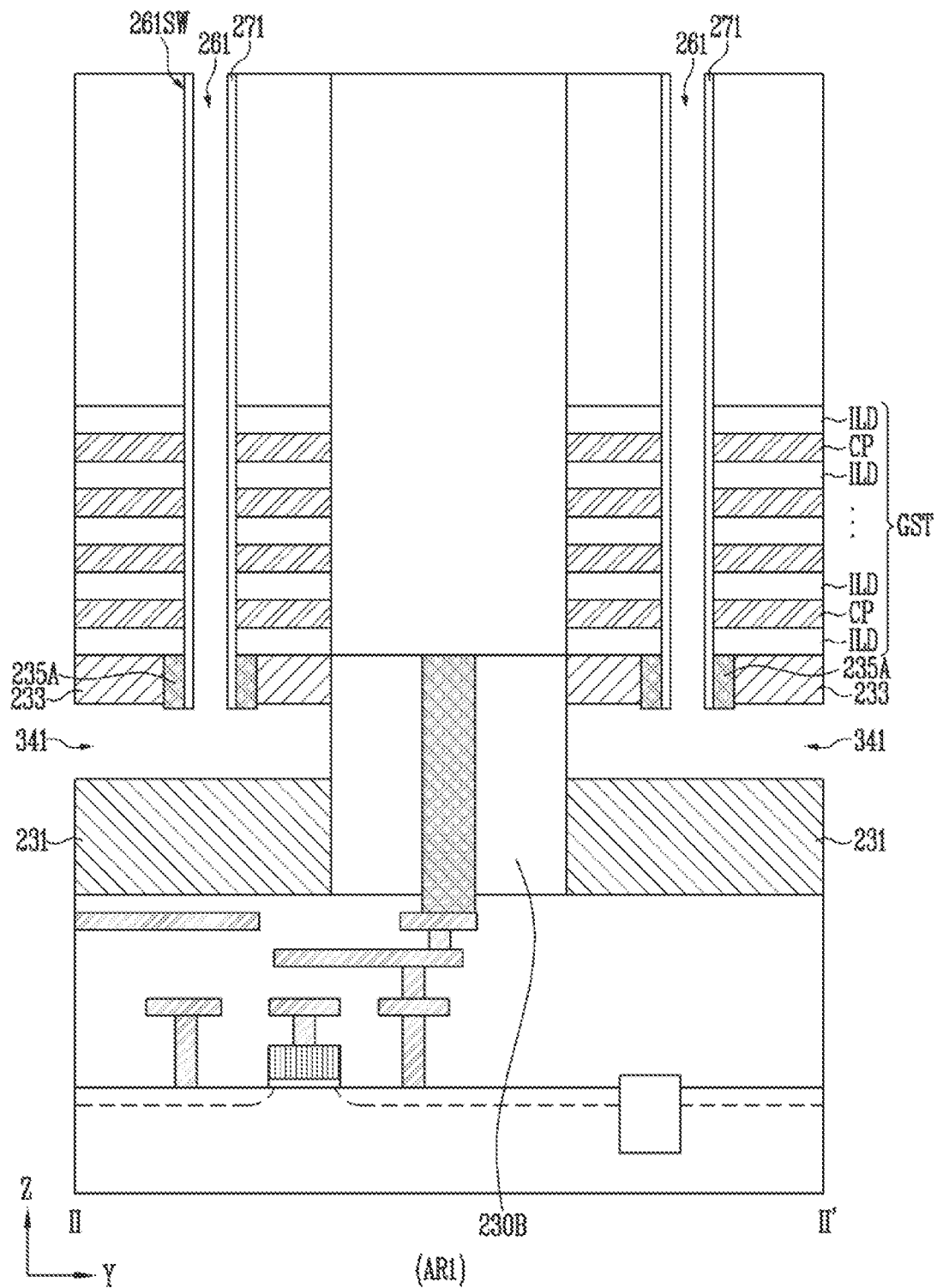
Figure 16C:
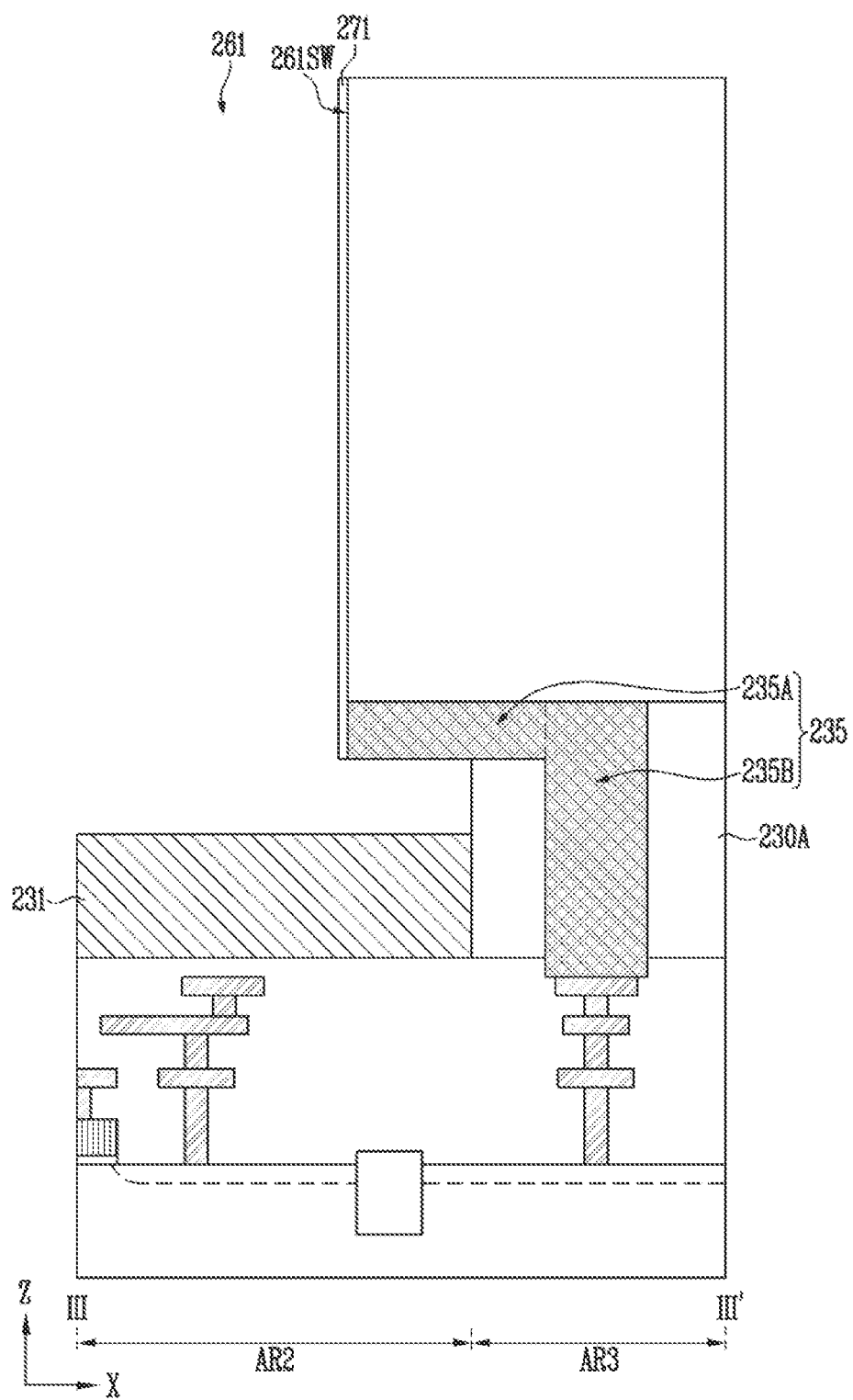

Referring to FIGS. 16A to 16C, the plurality of conductive patterns CP may be formed in the plurality of gate regions 331 shown in FIGS. 15A and 15B. In an embodiment, referring to FIGS. 16A to 16C, the plurality of gate regions 331 shown in FIGS. 15A and 15B may be filled with the plurality of conductive patterns CP. The plurality of remaining first material layers may be defined as the plurality of interlayer insulating layers ILD. The gate stack GST may be defined, by replacing the plurality of second material layers 232 with the plurality of conductive patterns CP through the preliminary slit 261A as described above with reference to FIGS. 15A to 15C and 16A to 16C.

After the gate stack GST is formed, a portion of the horizontal pattern 235A of the metal structure 235 may be removed through the preliminary slit 261A shown in FIGS. 15A to 15C. Accordingly, the slit 261 passing through the horizontal pattern 235A may be defined.

Thereafter, the spacer insulating layer 271 may be formed on a sidewall 261SW of the slit 261. Subsequently, an etching process such as an etch-back process may be performed to expose the sacrificial layer 303 shown in FIGS. 15A to 15C. Thereafter, an etching process of selectively removing the sacrificial layer 303 shown in FIGS. 15A to 15C may be performed. As the sacrificial layer 303 is removed, the memory layer ML, the dummy memory layer DML, the first protective layer 301, and the second protective layer 303 shown in FIGS. 15A to 15C may be exposed.

Thereafter, a portion of each of the memory layer ML and the dummy memory layer DML exposed between the first semiconductor layer 231 and the second semiconductor layer 233 may be removed. The first protective layer 301 and the second protective layer 303 shown in FIGS. 15A to 15C may be removed while the portion of each of the memory layer ML and the dummy memory layer DML is removed.

Through the above-described process, a horizontal space 341 between the first semiconductor layer 231 and the second semiconductor layer 233 may be defined, and the channel layer CH and the dummy channel layer DCH may be exposed by the horizontal space 341. In addition, the memory layer ML shown in FIG. 15A may be divided into the first memory pattern ML1 and the second memory pattern ML2 by the horizontal space 341, and the dummy memory layer ML shown in FIG. 15A may be divided into the first dummy memory pattern DML1 and the second dummy memory pattern DML2 by the horizontal space 341.

Figure 17A:
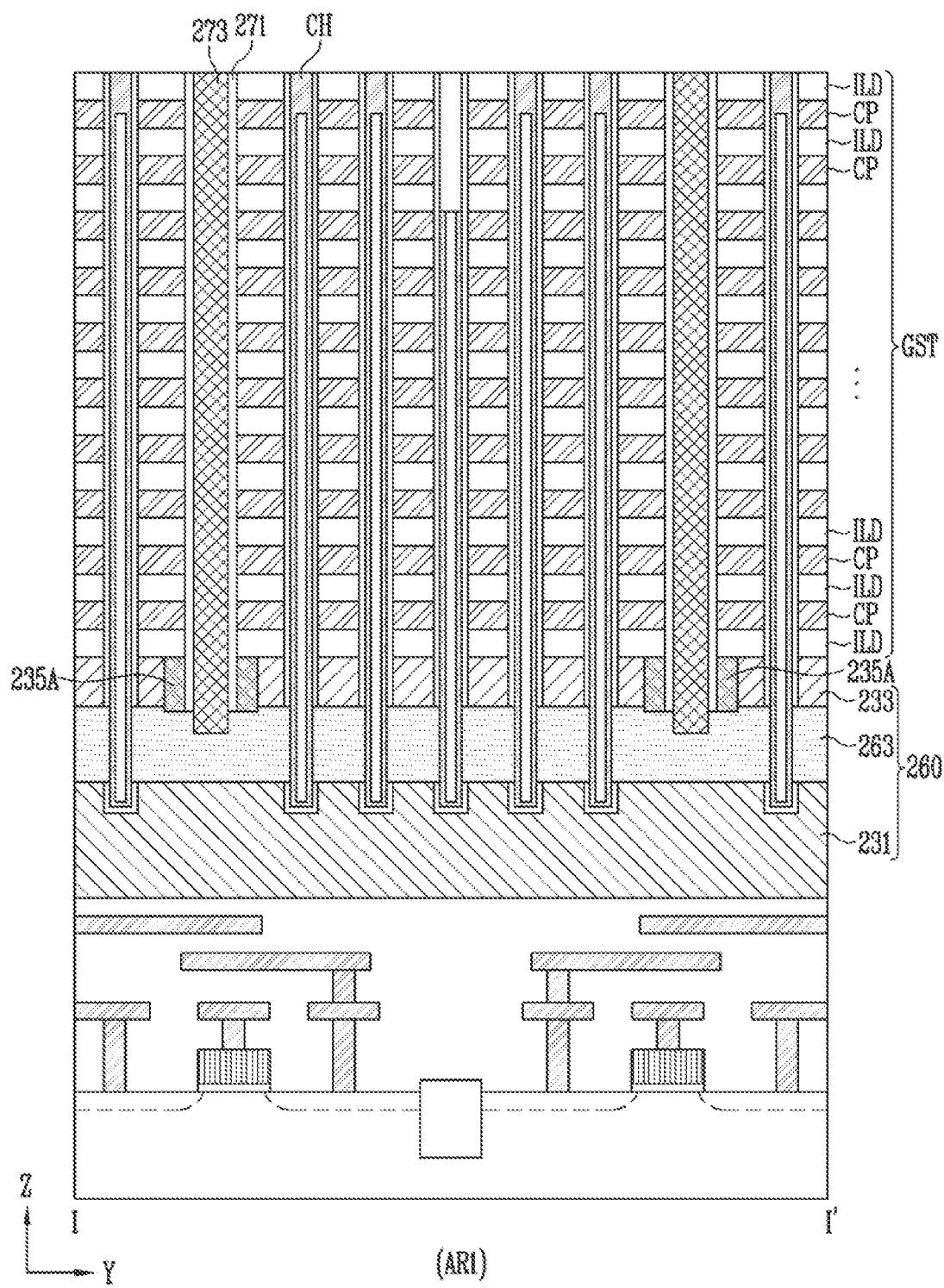
Figure 17B:
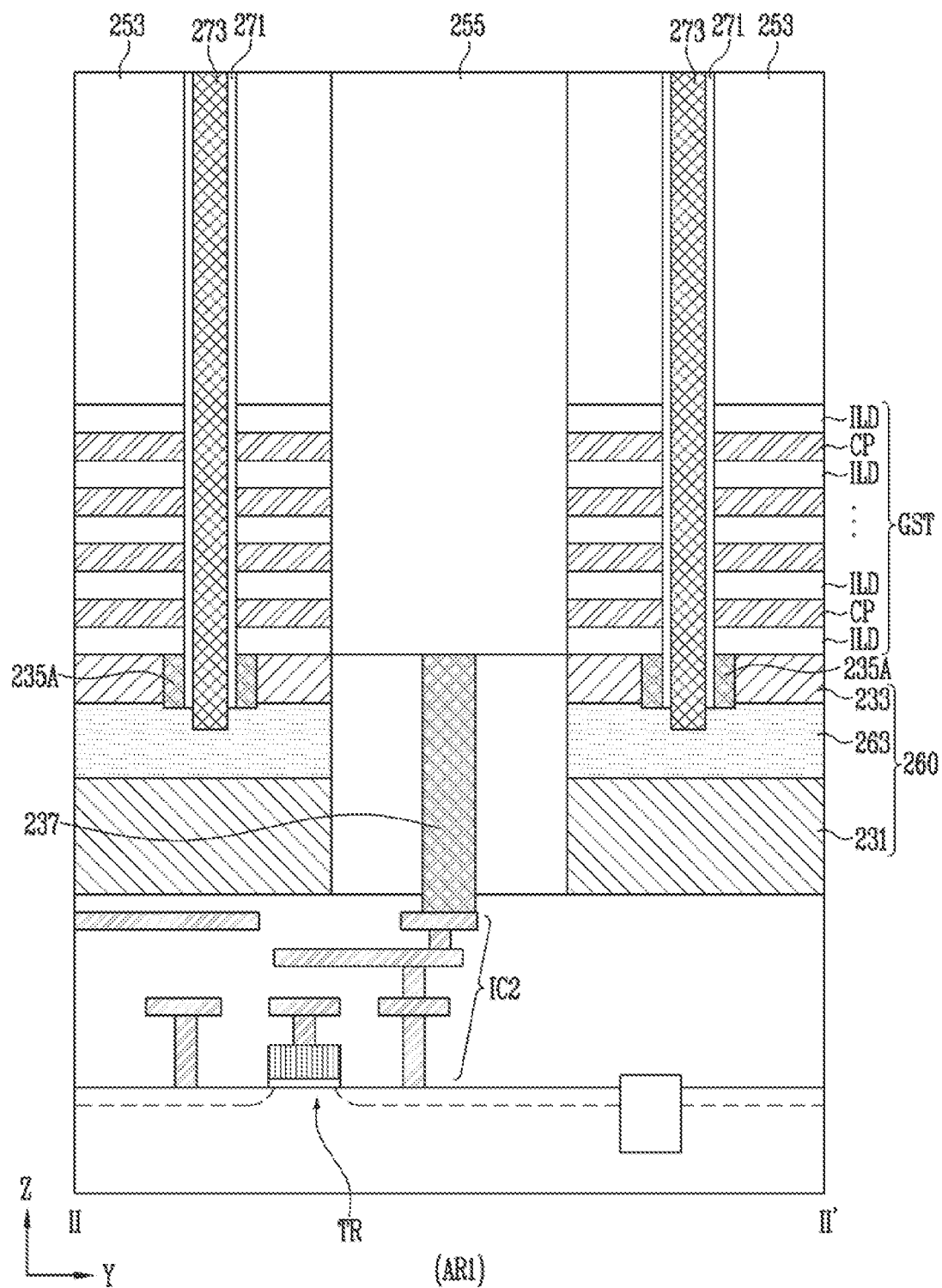
Figure 17C:
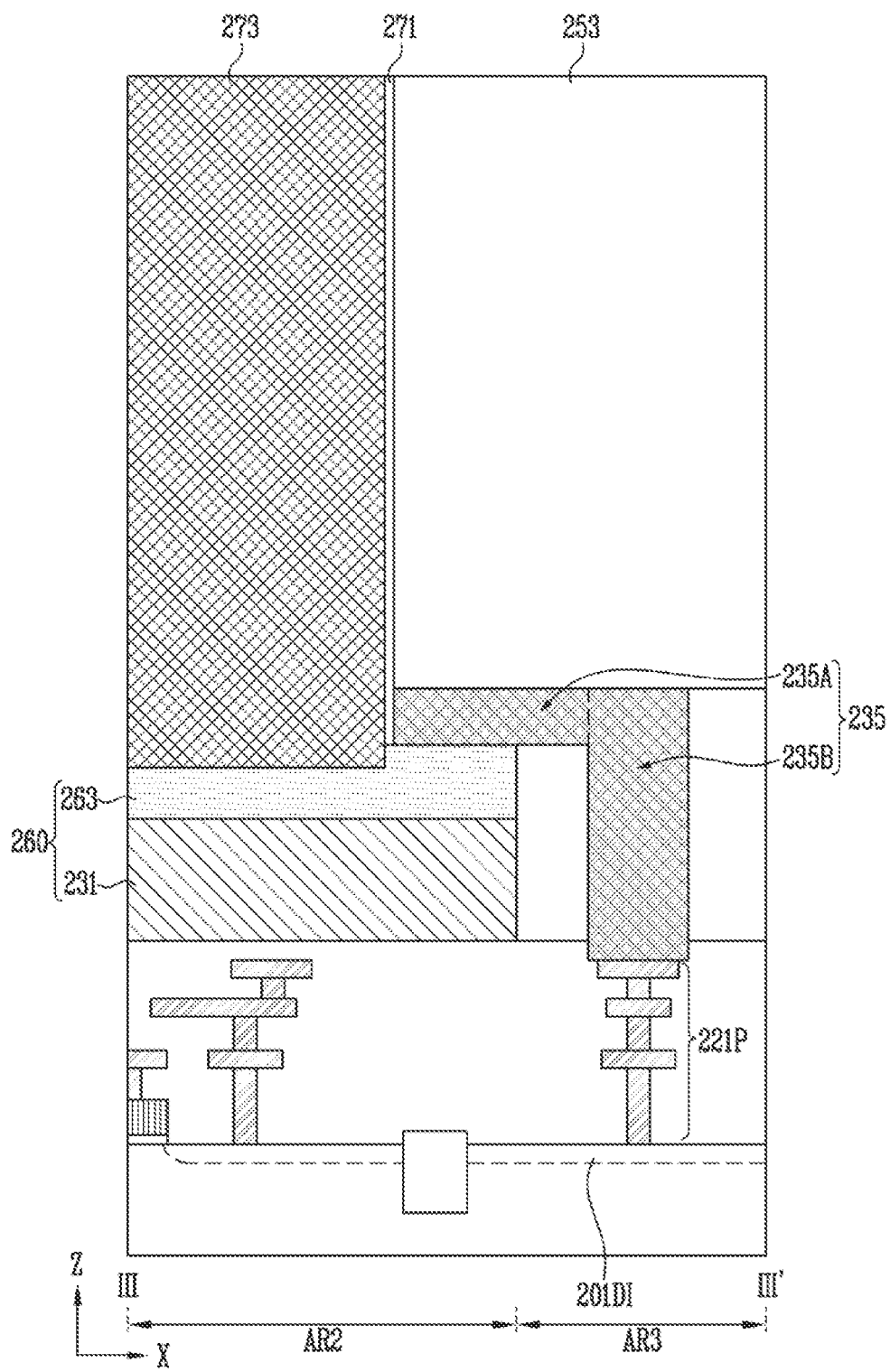

Referring to FIGS. 17A to 17C, the horizontal space 341 shown in FIGS. 16A to 16C may be filled with the interlayer semiconductor layer 263 through the slit 261 shown in FIGS. 16A to 16C. The interlayer semiconductor layer 263 may include a doped semiconductor layer. The interlayer semiconductor layer 263 may include an impurity of a conductivity type different from that of the discharge region 201DI. As an embodiment, the discharge region 201DI may include a p-type impurity, and the interlayer semiconductor layer 263 may include an n-type impurity.

As described with reference to FIGS. 16A to 16C and 17A to 17C, the first protective layer 301, the sacrificial layer 303, and the second protective layer 305 shown in FIGS. 15A to 15C may be replaced with the interlayer semiconductor layer 263 through the slit 261, and thus the source structure 260 connected to the channel layer CH may be defined.

Subsequently, the conductive source contact 273 filling the slit 261 shown in FIGS. 16A to 16C may be formed. The conductive source contact 273 may be disposed on the spacer insulating layer 271, and may be insulated from the conductive pattern CP of the gate stack GST by the spacer insulating layer 271.

Thereafter, a subsequent process such as forming the upper contact 277 shown in FIG. 5B may be performed.

Figure 18:
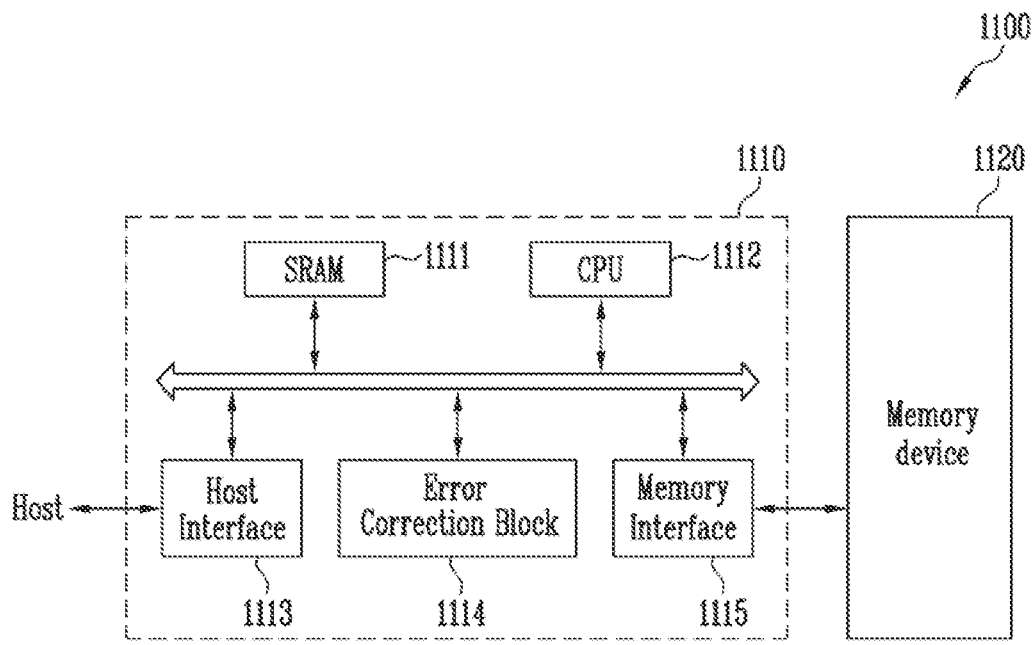
FIG. 18 is a block diagram illustrating a configuration of a memory system according to an embodiment of the present disclosure.

FIG. 18 is a block diagram illustrating a configuration of a memory system according to an embodiment of the present disclosure.

Referring to FIG. 18, the memory system 1100 includes a memory device 1120 and a memory controller 1110.

The memory device 1120 may be a multi-chip package configured of a plurality of flash memory chips. The memory device 1120 may include a metal structure having a horizontal pattern in a trench of a source structure and a vertical pattern extending from the horizontal pattern toward a semiconductor substrate.

The memory controller 1110 may be configured to control the memory device 1120, and may include static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs an overall control operation for data exchange of the memory controller 1110, and the host interface 1113 include a data exchange protocol of a host connected to the memory system 1100. The error correction block 1114 detects an error included in data read from the memory device 1120 and corrects the detected error. The memory interface 1115 performs interfacing with the memory device 1120. The memory controller 1110 may further include read only memory (ROM) that stores code data for interfacing with the host.

The above-described memory system 1100 may be a memory card or a solid state drive (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 19:
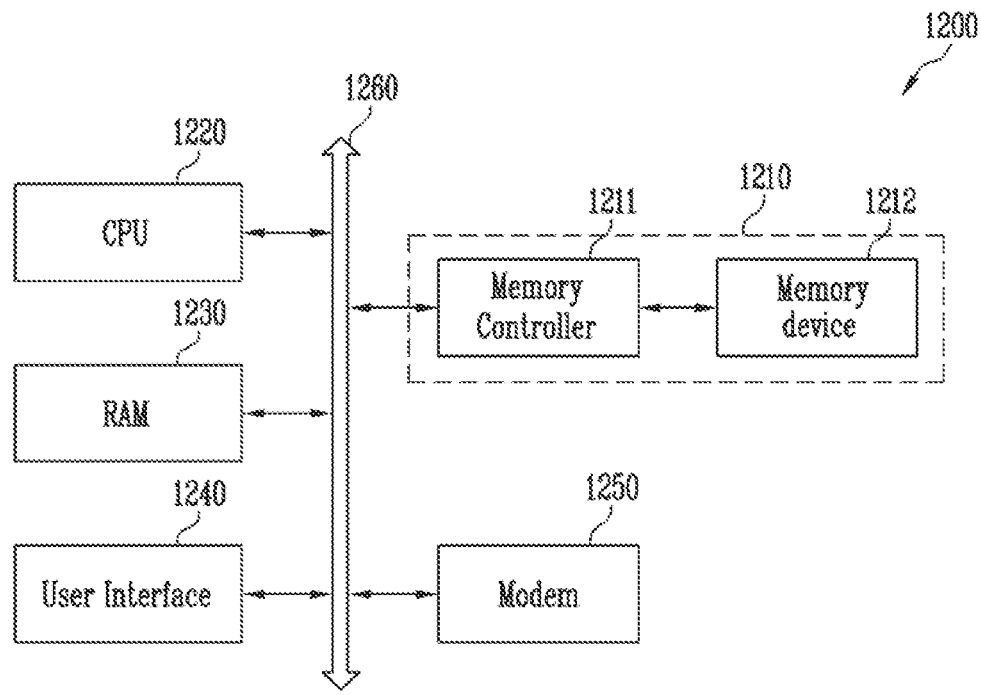
FIG. 19 is a block diagram illustrating a configuration of a computing system according to an embodiment of the present disclosure.

FIG. 19 is a block diagram illustrating a configuration of a computing system according to an embodiment of the present disclosure.

Referring to FIG. 19, the computing system 1200 may include a CPU 1220, random access memory (RAM) 1230, a user interface 1240, a modem 1250, and a memory system 1210 electrically connected to a system bus 1260. When the computing system 1200 is a mobile device, a battery for supplying an operation voltage to the computing system 1200 may be further included, and an application chipset, an image processor, mobile DRAM, and the like may be further included.

The memory system 1210 may include a memory device 1212 and a memory controller 1211.

The memory device 1212 may include a metal structure having a horizontal pattern in a trench of a source structure and a vertical pattern extending from the horizontal pattern toward a semiconductor substrate.

The memory controller 1211 may have the same configuration as the memory controller 1110 described above with reference to FIG. 18.

In accordance with some embodiments of the present disclosure, the metal structure may include the horizontal pattern and the vertical pattern extending from the horizontal pattern. The horizontal pattern of the metal structure may be used as an etch stop layer in forming a slit passing through a preliminary gate stack. The vertical pattern of the metal structure may be in contact with the source stack, and thus may be used as a discharge path of charges while an etching process for forming a channel hole passing through the preliminary gate stack is in progress. Accordingly, the present technology may improve stability of a manufacturing process of a semiconductor memory device and provide a semiconductor memory device with improved reliability.

What is claimed is:

1. A semiconductor memory device comprising:
    a semiconductor substrate including an upper surface extending in a horizontal direction;
    a source structure including a trench extending in the horizontal direction, the source structure disposed above the semiconductor substrate;
    a metal structure in the trench of the source structure and connecting the source structure to the semiconductor substrate; and
    memory cell strings disposed on both sides of the trench and connected to the source structure,
    wherein the metal structure comprises:
    a horizontal pattern in the trench; and
    a vertical pattern extending from the horizontal pattern toward the semiconductor substrate.

2. The semiconductor memory device of claim 1, wherein the horizontal pattern of the metal structure protrudes further than the source structure in the horizontal direction.

3. The semiconductor memory device of claim 2, wherein the vertical pattern of the metal structure is spaced apart from the source structure in the horizontal direction.

4. The semiconductor memory device of claim 1, wherein the semiconductor substrate includes a plurality of impurity regions separated by an isolation layer,
the plurality of impurity regions include a discharge region and a junction of a transistor, and
the vertical pattern of the metal structure is connected to the discharge region.

5. The semiconductor memory device of claim 4, wherein the discharge region includes an impurity of a conductivity type different from that of the source structure.

6. The semiconductor memory device of claim 5, wherein the source structure includes a doped semiconductor layer including an n-type impurity, and
the discharge region includes a p-type impurity.

7. The semiconductor memory device of claim 4, wherein the metal structure includes a metal of which a work function is greater than that of the source structure.

8. The semiconductor memory device of claim 7, wherein the metal structure includes tungsten.

9. The semiconductor memory device of claim 4, further comprising:
a lower insulating structure disposed between the semiconductor substrate and the source structure; and
an interconnection electrically connecting the discharge region and the vertical pattern of the metal structure and buried in the lower insulating structure.

10. The semiconductor memory device of claim 1, wherein the source structure comprises:
a first semiconductor layer extending in the horizontal direction and overlapping the trench;
a second semiconductor layer disposed above the first semiconductor layer and passed through by the trench; and
an interlayer semiconductor layer disposed between the first semiconductor layer and the second semiconductor layer and overlapping the trench.

11. The semiconductor memory device of claim 10, wherein the horizontal pattern of the metal structure is in contact with an upper surface of the interlayer semiconductor layer.

12. The semiconductor memory device of claim 1, further comprising:
a lower insulating structure disposed at a level between the semiconductor substrate and the source structure to cover the semiconductor substrate; and
a source insulating pattern disposed on the lower insulating structure and disposed between the source structure and the vertical pattern of the metal structure,
wherein the horizontal pattern extends on the source insulating pattern.

13. A semiconductor memory device comprising:
a semiconductor substrate including a first region, a second region, and a third region, the second region being disposed between the first region and the third region;
gate stacks disposed above the first region of the semiconductor substrate;
a source structure disposed at a level between each of the gate stacks and the semiconductor substrate to overlap the first region and the second region of the semiconductor substrate;
a first source insulating pattern disposed at a level between each of the gate stacks and the semiconductor substrate to overlap the third region of the semiconductor substrate;
a vertical structure disposed between the gate stacks and extending into the source structure; and
a metal structure connecting the source structure to the semiconductor substrate,
wherein the metal structure comprises:
a vertical pattern overlapping the third region of the semiconductor substrate and passing through the first source insulating pattern; and
a horizontal pattern extending in a horizontal direction substantially parallel to an upper surface of the semiconductor substrate from the vertical pattern toward the vertical structure.

14. The semiconductor memory device of claim 13, wherein the vertical pattern of the metal structure is spaced apart from the source structure by the first source insulating pattern.

15. The semiconductor memory device of claim 13, wherein the source structure comprises:
a first semiconductor layer disposed at a level between the semiconductor substrate and the horizontal pattern of the metal structure;
a second semiconductor layer disposed above the first semiconductor layer and passed through by the horizontal pattern of the metal structure; and
an interlayer semiconductor layer disposed between the first semiconductor layer and the second semiconductor layer and including an upper surface that is in contact with the horizontal pattern of the metal structure.

16. The semiconductor memory device of claim 15, wherein the vertical structure extends toward the semiconductor substrate to pass through the second semiconductor layer, and
the horizontal pattern of the metal structure extends between the vertical structure and the second semiconductor layer.

17. The semiconductor memory device of claim 16, wherein the vertical structure comprises:
a conductive source contact that is in contact with the interlayer semiconductor layer and extending between the gate stacks; and
a spacer insulating layer disposed between each of the gate stacks and the conductive source contact and extending between the horizontal pattern of the metal structure and the conductive source contact.

18. The semiconductor memory device of claim 13, wherein the semiconductor substrate includes a plurality of impurity regions separated by an isolation layer,
the plurality of impurity regions include a discharge region and a junction of a transistor, and
the vertical pattern of the metal structure is connected to the discharge region.

19. The semiconductor memory device of claim 18, further comprising:
a lower insulating structure disposed between the semiconductor substrate and the source structure;
a first interconnection electrically connecting the discharge region and the vertical pattern of the metal structure and buried in the lower insulating structure;
a filling insulating layer passing through at least one of the gate stacks;
a second source insulating pattern overlapping the filling insulating layer and passing through the source structure;

a second interconnection connected to the junction of the transistor and buried in the lower insulating structure;

a lower contact passing through the second source insulating pattern and connected to the second interconnection; and an upper contact passing through the filling insulating layer and connected to the lower contact.

20. The semiconductor memory device of claim 13, further comprising:

a channel layer passing through each of the gate stacks and connected to the source structure; and a memory layer disposed between each of the gate stacks and the channel layer, wherein each of the gate stacks includes interlayer insulating layers and conductive patterns alternately disposed on the source structure.

* * * * *